US010851800B2

(12) United States Patent
He et al.

(10) Patent No.: US 10,851,800 B2
(45) Date of Patent: Dec. 1, 2020

(54) BLOWER SYSTEM WITH DUAL OPPOSITE OUTLETS AND FAN DIAMETER APPROACHING TO BLOWER HOUSING DIMENSION FOR INFORMATION HANDLING SYSTEMS

(71) Applicant: Dell Products, LP, Round Rock, TX (US)

(72) Inventors: Qinghong He, Austin, TX (US); Arnold Thomas Schnell, Hutto, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/813,464

(22) Filed: Mar. 9, 2020

(65) Prior Publication Data

US 2020/0340493 A1    Oct. 29, 2020

Related U.S. Application Data

(63) Continuation of application No. 16/395,138, filed on Apr. 25, 2019, now Pat. No. 10,584,717.

(51) Int. Cl.
*F04D 29/42* (2006.01)
*G06F 1/20* (2006.01)
*H05K 7/20* (2006.01)

(52) U.S. Cl.
CPC ........... *F04D 29/4246* (2013.01); *G06F 1/20* (2013.01); *H05K 7/20145* (2013.01);
(Continued)

(58) Field of Classification Search
CPC combination set(s) only.
See application file for complete search history.

(56) References Cited

U.S. PATENT DOCUMENTS 2,330,938 A * 10/1943 Williams ............ F04D 29/4246
415/208.3
3,592,260 A *  7/1971 Berger .................... F28F 13/06
165/121

(Continued)

*Primary Examiner* — Lisa Lea-Edmonds
(74) *Attorney, Agent, or Firm* — Prol Intellectual Property Law, PLLC; H. Kenneth Prol

(57) ABSTRACT

An information handling system comprising a chassis supporting a central processor, a graphics processor, a memory, and a power source and a dual opposite outlet blower system having a powered blower fan for rotating a plurality of blades within a dual opposite outlet blower system housing where the dual opposite outlet blower system housing includes first surface and a second surface oppositely disposed on either side of a rotational plane of the powered blower fan, a first side wall having a first notch extending internally along a diameter in the rotational plane of the powered blower fan and second side wall oppositely disposed to the first side wall and having a second notch extending internally along the opposite side of the diameter in the rotational plane of the powered blower fan. The dual opposite outlet blower system housing includes a first outlet aperture in the rotational plane of the blower fan moving air in a first direction to pressurize an internal cavity of the chassis a second outlet aperture in the rotational plane of the blower fan moving air in a second direction generally opposite to the first direction.

20 Claims, 10 Drawing Sheets

(52) U.S. Cl.
CPC ..... *H05K 7/20154* (2013.01); *H05K 7/20172* (2013.01); *G06F 2200/201* (2013.01)

(56) References Cited

U.S. PATENT DOCUMENTS

| | | | |
|---|---|---|---|
| 3,950,112 A | 4/1976 | Crump | |
| 6,021,042 A * | 2/2000 | Anderson | G06F 1/20 |
| | | | 165/127 |
| 6,328,097 B1 | 12/2001 | Bookhardt | |
| 6,373,700 B1 | 4/2002 | Wang | |
| 6,525,936 B2 * | 2/2003 | Beitelmal | G06F 1/20 |
| | | | 165/122 |
| 6,567,269 B2 | 5/2003 | Homer | |
| 6,652,223 B1 | 11/2003 | Horng | |
| 6,789,999 B2 * | 9/2004 | Bikos | B60H 1/00471 |
| | | | 415/206 |
| 6,989,988 B2 * | 1/2006 | Arbogast | G06F 1/20 |
| | | | 165/121 |
| 7,071,587 B2 | 7/2006 | Lopatinsky | |
| 7,079,388 B2 * | 7/2006 | Faneuf | H05K 7/20727 |
| | | | 361/679.51 |
| 7,079,394 B2 * | 7/2006 | Mok | G06F 1/203 |
| | | | 361/700 |
| 7,215,543 B2 * | 5/2007 | Arbogast | G06F 1/20 |
| | | | 165/121 |
| 8,104,295 B2 * | 1/2012 | Lofy | B60H 1/00592 |
| | | | 62/3.61 |
| 8,142,147 B2 * | 3/2012 | O'Connor | F04D 29/4246 |
| | | | 415/204 |
| 9,845,805 B2 * | 12/2017 | Bhutani | F04D 29/703 |
| 10,485,135 B2 * | 11/2019 | He | G06F 1/203 |
| 10,539,150 B2 * | 1/2020 | Ling | F04D 29/282 |
| 10,584,717 B1 * | 3/2020 | He | G06F 1/203 |
| 10,687,440 B1 * | 6/2020 | He | F04D 29/584 |
| 2002/0172008 A1 | 11/2002 | Michael | |
| 2003/0161102 A1 | 8/2003 | Lee | |
| 2003/0220721 A1 | 11/2003 | Cohen | |
| 2004/0099404 A1 * | 5/2004 | Cipolla | H01L 23/467 |
| | | | 165/80.3 |
| 2006/0078428 A1 | 4/2006 | Zheng | |
| 2006/0193113 A1 | 8/2006 | Cohen | |
| 2006/0263210 A1 * | 11/2006 | Wang | F04D 25/166 |
| | | | 415/206 |
| 2007/0160462 A1 * | 7/2007 | Tsang | F04D 29/4246 |
| | | | 415/143 |
| 2007/0227699 A1 | 10/2007 | Nishi | |
| 2007/0268668 A1 | 11/2007 | Lin | |
| 2008/0035315 A1 | 2/2008 | Han | |
| 2008/0229758 A1 | 9/2008 | Lin | |
| 2009/0266518 A1 | 10/2009 | Huang | |
| 2009/0324403 A1 | 12/2009 | Zheng | |
| 2010/0071875 A1 * | 3/2010 | Hwang | G06F 1/203 |
| | | | 165/80.3 |
| 2011/0097195 A1 | 4/2011 | Horng | |
| 2011/0110774 A1 | 5/2011 | Horng | |
| 2011/0203295 A1 | 8/2011 | Hsu | |
| 2011/0251733 A1 | 10/2011 | Atkinson | |
| 2011/0272120 A1 | 11/2011 | Joshi | |
| 2013/0011255 A1 | 1/2013 | Horng | |
| 2013/0243628 A1 | 9/2013 | Zheng | |
| 2014/0063726 A1 * | 3/2014 | Liu | G06F 1/20 |
| | | | 361/679.33 |
| 2014/0092556 A1 | 4/2014 | Turney | |
| 2014/0185240 A1 | 7/2014 | Macdonald | |
| 2015/0003974 A1 | 1/2015 | Heymann | |
| 2015/0116928 A1 | 4/2015 | Delano | |
| 2016/0003261 A1 | 1/2016 | Tamaoka | |
| 2016/0037683 A1 | 2/2016 | Tamaoka | |
| 2016/0369811 A1 * | 12/2016 | Ling | F04D 29/661 |
| 2017/0359920 A1 | 12/2017 | Huang | |
| 2019/0008073 A1 * | 1/2019 | He | H05K 7/20509 |
| 2019/0184868 A1 * | 6/2019 | Kim | F04D 29/4246 |
| 2020/0027808 A1 | 1/2020 | Subrahmanyam | |

\* cited by examiner

BLOWER SYSTEM WITH DUAL OPPOSITE OUTLETS AND FAN DIAMETER APPROACHING TO BLOWER HOUSING DIMENSION FOR INFORMATION HANDLING SYSTEMS

This application is a continuation of prior application Ser. No. 16/395,138, entitled "BLOWER SYSTEM WITH DUAL OPPOSITE OUTLETS AND FAN DIAMETER APPROACHING TO BLOWER HOUSING DIMENSION FOR INFORMATION HANDLING SYSTEMS," filed on Apr. 25, 2019, which is assigned to the current assignee hereof and is incorporated herein by reference in its entirety.

FIELD OF THE DISCLOSURE

The present disclosure generally relates to a method and apparatus for blower systems for movement of air with efficient size occupancy. In particular, the present disclosure relates to blower systems for use with an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, and networking systems. Information handling systems can also implement various virtualized architectures. Data communications among information handling systems may be via networks that are wired, wireless, optical or some combination. Further, powerful graphics system may be desirable for use with current applications even for information handling systems have limited internal space to house components or for information handling systems requiring thin profiles such as mobile information handling systems. Components within information handling systems performing various functions may need to be designed for implementation in many form factors requiring variation to maintain space efficiency. The various components, such as a processor or graphics system, may generate heat that may require dissipation. Air movement via a fan system or other cooling system may be used to alleviate heat build-up within an information handling system. Previous systems, such as shown in FIG. 2, were inefficiently bulky. The present disclosure describes an efficient blower system which may be used as part of a thermal control system for an information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), non-volatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

Figure 1:
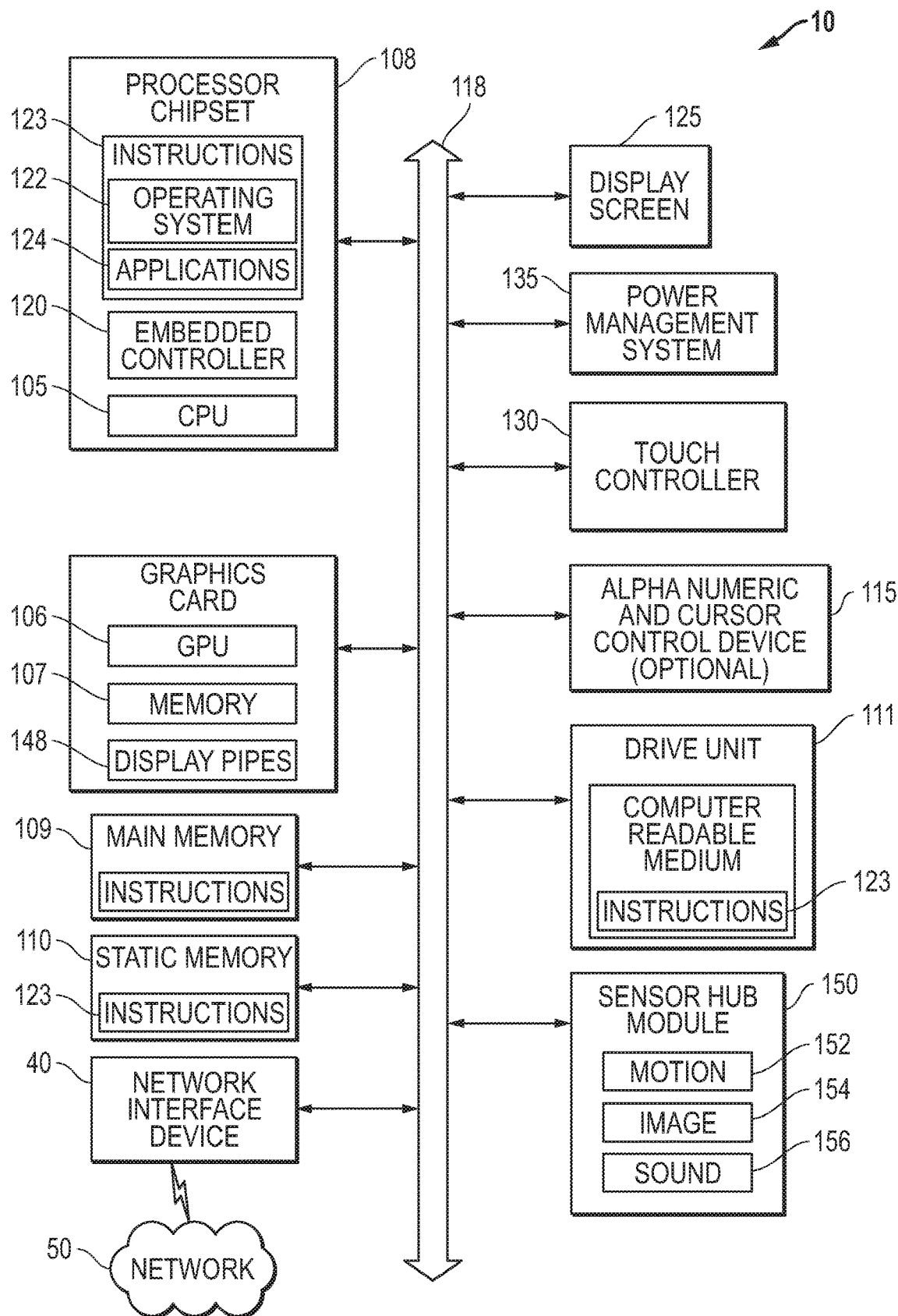
FIG. 1 is a block diagram illustrating an information handling system according to an embodiment of the present disclosure.

FIG. 1 shows an information handling system 10 capable of administering several of the embodiments of the present disclosure. The information handling system 10 can represent information handling systems utilizing blower systems such as embodiments shown in FIGS. 3-13 and implementation of the embodiments described in FIG. 14 and FIG. 15. Information handling system 10 may represent an information handling system such as a mobile information handling system with graphics processing capabilities. A mobile information handling system may execute instructions via a processor for a plurality of application programs and operating systems as understood. Information handling system 10 may also represent a networked server or other system. The information handling system 10 may include a processor such as a central processing unit (CPU) 105, a graphics processing unit (GPU) 106, or both. Moreover, the information handling system 10 can include a main memory 109 and a static memory 110 that can communicate with each other via a bus 118.

Channels or data lanes for various digital display data communication standards including bus architectures such as PCIe or display data interface standards such as DisplayPort (DP), or eDP. Such standards may be used for communications between the CPU 105 and GPU 105 as a bus 118 for chipset communications.

As shown, the information handling system 10 may further include a video display 125 and in some embodiments a second display screen or more display screens. Display screen 125 may be of a variety of display devices, such as a liquid crystal display (LCD), an organic light emitting diode (OLED), a flat panel display, a solid state display, or a cathode ray tube (CRT). Display 125 may include one or more touch screen display modules and touch screen controllers 130 for receiving user inputs to the information handling system 10. In the case of information handling systems with flat panel display systems including LCD or OLED displays, it is desirable to minimize a thickness of the information handling system while maximizing the power of the graphics display system to accommodate, for example, a large size of the display(s) on the surface of the information handling system. In some cases, mobile information handling systems may have very limited thickness in a chassis to accommodate the display, motherboard, and a separate graphics board for enhanced graphics processing power or performance. Thus, the thickness or "Z" dimension space may be very limited for internal components and may particularly be limited according to current systems for linking a motherboard and distinct graphics board. In particular, for high performance information handling systems may generate heat, especially via processing systems such as CPU 105 and GPU 106. A shared heat pipe system may be employed or two separate heat pipes may be used for the CPU 105 and GPU 106. A heat pipe with complex bends may be less efficient and more costly to manufacture. Multiple heat pipes may increase costs of an information handling system as well. Capability to locate fin stacks for cooling almost anywhere within a chassis of an information handling system provides for advantageous design options to reduce complexity and cost or to provide flexibility in location of components. Moreover, an efficiently sized blower system with beneficial air moving capacity may contribute to an overall savings in space or improve performance of an information handling system.

Additionally, the information handling system 10 may include an input device 115, such as a keyboard, and a cursor control device, such as a mouse or touchpad or similar peripheral input device. The information handling system may include a power source such as battery or an A/C power source that may be managed by a power management system 135. The information handling system 10 can also include a disk drive unit 111, and a signal generation device such as a speaker or remote control or other device (not shown). The information handling system 10 can include a network interface device 40 such as a wired adapter or a wireless adapter or similar wireless radio system to accommodate a variety of wireless communication protocols. The information handling system 10 can also represent a server device whose resources can be shared by multiple client devices, or it can represent an individual client device, such as a desktop personal computer, a laptop computer, a tablet computer, a mobile smartphone, or a wearable computing device.

The information handling system 10 can include a set of instructions 123 that can be executed to cause the computer system to perform any one or more computer-based functions. Set of instructions 123 may be stored in non-volatile storage media such as with static memory 110 or drive unit 111. Various software modules comprising application instructions 124 or other sets of instructions 123 may be coordinated by an operating system (OS) 122 and via an application programming interface (API). An example operating system may include Windows®, Android®, and other OS types known in the art. Example APIs may include Win 32, Core Java API, or Android APIs. In a further example, processor 105 may conduct processing of sets of instructions in software, firmware, hardware or any combination of the same to achieve functions understood to be performed by the information handling system 10 according to disclosures herein. Further one or more embedded controllers 120 may also be included in the chipset, on the motherboard, or in the graphics board to provide for additional processing or execution of instructions in addition to processing conducted by the CPU 105 or GPU 106 as understood in some embodiments. The computer system 10 may operate as a standalone device or may be connected such as using a network, to other computer systems or peripheral devices.

In a networked deployment, the information handling system 10 may operate in the capacity of a server or as a client user computer in a server-client user network environment, or as a peer computer system in a peer-to-peer (or distributed) network environment. The information handling system 10 can also be implemented as or incorporated into various devices, such as a personal computer (PC), a tablet PC, a set-top box (STB), a PDA, a mobile information handling system, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 10 can be implemented using electronic devices that provide voice, video, or data communication. Further, while a single information handling system 10 is illustrated, the term "system" shall also be taken to include any collection of systems or sub-systems that individually or jointly execute a set, or multiple sets, of instructions to perform one or more computer functions.

The static memory 110 or disk drive unit 111 may include a computer-readable medium in which one or more sets of instructions 123 such as software that can be embedded or stored. For example, applications 124 may include software instructions stored as sets of instructions 123 in static memory 110 or disk drive 111. Similarly, main memory 109 and static memory 110 may also contain computer-readable medium for storage of one or more sets of instructions, parameters, or profiles 123 such as operating system 122 or applications 124. The disk drive unit 111 and static memory 110 also contains space for data storage. Further, the instructions 123 may embody one or more of the methods or logic for applications, such as 124, that operate on the information handling system to display graphical content for example. Additionally, instructions relating to the various software algorithms and data may be stored here. The instructions, parameters, and profiles 123 may reside completely, or at least partially, within the main memory 109, the static memory 110, and/or within the disk drive 111 during execution by the processor 105 of information handling system 10. As explained, some or all the software, firmware or hardware instructions may be executed locally or remotely. The main memory 109 and the processor 105 also may include computer-readable media.

The network interface device 40, such as a wireless adapter, can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 40 may include one or more radio frequency subsystems with transmitter/receiver circuitry, wireless controller circuitry, amplifiers and other circuitry for wireless communications. Each radiofrequency subsystem may communicate with one or more wireless technology protocols. The wireless adapter 40 may also include antenna system which may be tunable antenna systems in some embodiments.

The wireless adapter 40 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. Wireless adapter 120 may connect to any combination of macro-cellular wireless connections including 2G, 2.5G, 3G, 4G, 5G or the like from one or more service providers. The wireless adapter 40 can represent an add-in card, wireless network interface module that is integrated with a main board of the information handling system or integrated with another wireless network interface capability, or any combination thereof. In an embodiment the wireless adapter 40 may include one or more radio frequency subsystems including transmitters and wireless controllers for connecting via a multitude of wireless links. The radio frequency subsystems include wireless controllers to manage authentication, connectivity, communications, power levels for transmission, buffering, error correction, baseband processing, and other functions of the wireless adapter 40. The wireless adapter 40 may also connect to the external network via a WPAN, WLAN, WWAN or similar wireless switched Ethernet connection. The wireless data communication standards set forth protocols for communications and routing via access points, as well as protocols for a variety of other operations.

In some embodiments, dedicated hardware implementations such as application specific integrated circuits, programmable logic arrays and other hardware devices can be constructed to implement one or more of the applications operating on the information handling system 10. Applications that may include the apparatus and systems of various embodiments can broadly include a variety of electronic and computer systems. One or more embodiments may implement functions using two or more specific interconnected hardware modules or devices with related control and data signals that can be communicated between and through the modules, or as portions of an application-specific integrated circuit.

In accordance with various embodiments of the present disclosure, the applications executed by the information handling system may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 123 or receives and executes instructions, parameters, and profiles 123 responsive to a propagated signal; so that a device connected to a network 50 can communicate voice, video or data over the network 50. Further, the instructions 123 may be transmitted or received over the network 50 via the network interface device or wireless adapter 40.

In other aspects, computer-readable medium that includes instructions, parameters, and profiles 123 or receives and executes instructions, parameters, and profiles 123, such as from applications 124 or OS 122, responsive to a propagated signal may communicate digital display data or instructions. Digital display data may eventually be propagated to the graphic board and GPU 106 for processing via the GPU 106, graphics memory 107 and distributed via display pipes to one or more display screens 125 in some embodiments.

Information handling system 10 includes one or more application programs 124, and Basic Input/Output System and firmware (BIOS/FW) code. BIOS/FW code functions to initialize information handling system 10 on power up, to launch an operating system 122, and to manage input and output interactions between the operating system and the other elements of information handling system 10. In a particular embodiment, BIOS/FW code resides in memory 109, and includes machine-executable code that is executed by processor 105 to perform various functions of information handling system 10. In another embodiment, application programs 124 as a part of various instructions 123 and BIOS/FW code reside in another storage medium of information handling system 10. For example, application programs and BIOS/FW code can reside in drive 111, in a ROM (not illustrated) associated with information handling system 10, in an option-ROM (not illustrated) associated with various devices of information handling system 10, in storage system 109, static memory 110, in a storage system (not illustrated) associated with network channel of a wireless adapter 40, in another storage medium of information handling system 10, in display memory 107 in parts or in any combination thereof. Application programs 124 and BIOS/FW code can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2:
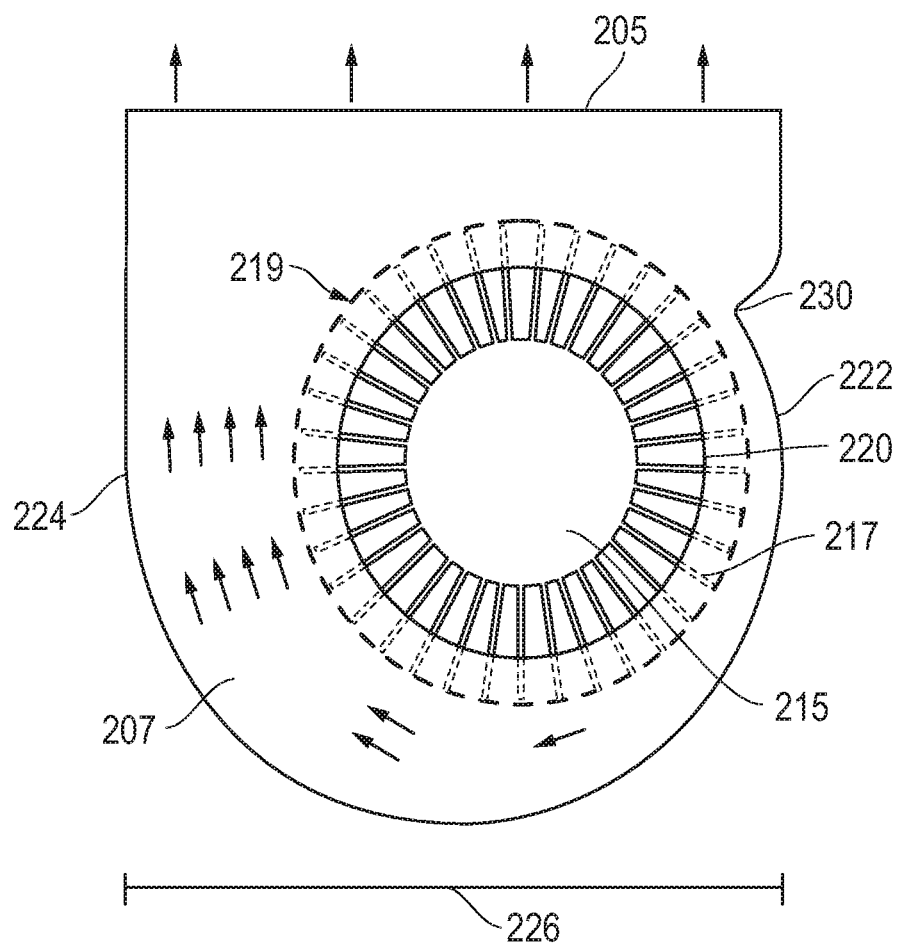
FIG. 2 is a top view of a blower system.

FIG. 2 illustrates a top view of a conventional blower system. The blower system includes a housing with side walls 222 and 224 and which surrounds a blower fan 215 with fan blades 217. The conventional blower system housing is depicted such that internal fan blades may be shown at their full diameter 219 within the blower case which has a second diameter 226. Air intake comprises a circular hole 220 which draws air down into the blower case by fan 215. As fan blades 217 pass notch 230 in side wall 222, the fan 215 may increase air pressure. Space 207 inside the fan housing opposite of notch 230 allows for air flow volume to increase such that air may be moved to outlet 205. In the shown fan blower system an inlet 220 draws air in, is compressed by blower fan 215 via spinning blades in the clockwise direction with the assistance of notch 230. Space 207 is required to provide an increase in airflow from fan 215 and air exists via outlet 205. Typically, in conventional blower fan systems of this type, the fan blade diameter 219 is optimally about 60%-70% of the fan case diameter 226. This permits air to accumulate in space 207 at the end of the pressurized area beginning at notch 230 to allow air volume to increase in space 207.

Although increasing blade size diameter can significantly increase airflow, to do so within the same diameter blower housing 226 is not effective as the air cannot easily exit the turn of the fan 215 through the pressurizing zone begun at notch 230. Space 207 is needed in conventional fan systems to allow air to escape the clockwise turning fan blades 217 to generate air volume build up to be moved out of blower outlet 205.

Figure 3A:
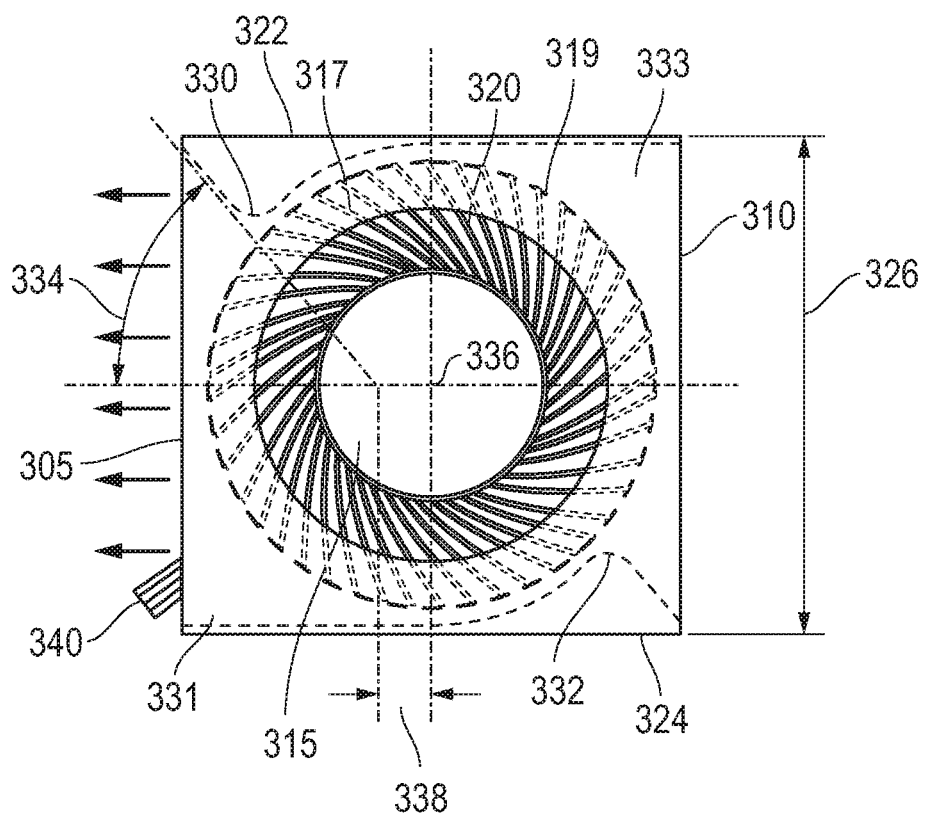
FIG. 3A is a top view of a blower with dual opposite outlets according to an embodiment of the present disclosure.

FIG. 3A shows a top view of a dual opposite outlet blower fan system according to an embodiment of the present disclosure. The dual opposite outlet blower system housing with side walls 322 and 324 is depicted such that elements within the dual opposite outlet blower system housing may be viewed. Dual opposite outlet blower system housing may have a width Df of 326 between side walls 322 and 324. In embodiments herein, the width Df 326 between side walls 322 and 324 does not account for an inward extension of notches 330 and 332 inside the dual opposite outlet blower system housing, but is the inner dimension between the side walls 322 and 324 as taken across the diameter of blower fan 315. Blower fan 315 may include fan blades 317 that may rotate clockwise, from viewer perspective of FIG. 3A, about rotation axis 336 and is powered by power source 340. Power source 340 may operatively connect a fan motor (not shown) to a power management system of an information handling system and supply power from a battery power source, an alternating current power source, or other power sources in various embodiments. Further, power source 340 may include one or more control cables to control blower fan 315 on/off, fan speed, or other features of blower fan 315 from a thermal management control system which may be part of the information handling system.

Blower fan 315 may have a blade diameter Db 319 that is nearer to the described width Df 326 of dual opposite outlet blower system housing between side walls 322 and 324 than conventional blower systems. In various example embodiments, the dual opposite outlet blower system housing of the embodiments of the present disclosure may enable the blower fan diameter Db 319 to occupy greater than 70% of the width Df 326 of the dual opposite outlet blower system housing between side walls 322 and 324. In other embodiments, the blower fan diameter Db 319 may be just short of the width Df 326 of the dual opposite outlet blower system housing such that the fan blades 317 do not contact the dual opposite outlet blower system housing. If the blower fan diameter Db 319 were the same as the width Df 326 of the dual opposite outlet, contact of fan blades 317 could be made with the dual opposite outlet blower system housing side walls 322 or 324 presumably causing risk of damage. Thus, this limit (100%) is the limit of the diameter Db 319 of the blower fan 315 with respect to the width Df 326 of the dual opposite outlet blower system housing between side walls 322 and 324. In some embodiments, an extension of side walls 322 and 324 of the dual opposite outlet blower system housing width 326 to accommodate a greater diameter Db 319 of the blower fan 315 is also contemplated. In an example embodiment, the diameter Db 319 of blower fan 315 may occupy greater than 70% of the width Df 326 between side walls 322 and 324. In other embodiments, the diameter Db 319 of blower fan 315 may occupy greater than 90% of the width Df 326 between side walls 322 and 324 make the space occupied by the dual opposite outlet blower system housing and blower fan 315 more efficient due to greater airflow improvement of the present disclosure. It is understood that blade diameter 319 applies to a fan blade system that is a generally circular component. Often however, a fan does not have a uniform external diameter dimension as it is not a perfectly round or may not be round at all. Nonetheless, the rotation of the blower fan may have a diameter that may apply as diameter Db 319 for purposes of variations on the embodiments herein.

In the example embodiment shown in FIG. 3A, blower fan 315 may include a fan hub which may rotate fan blades 317 extending from the hub. Rotation may be in the clockwise direction as shown in FIG. 3A. The fan hub may house a blower fan motor and other components of a blower fan 315. Other components may include the operative coupling of fan blades 317 to rotation shaft of a blower fan motor. In other embodiments, blower fan motor may be mounted below the fan hub or operatively coupled to the fan hub as understood by those of skill in design of the blower fan 315. Blower fan 315 may be subject to a variety of blower fan rotation speeds, blower fan control, as well as pitch, shape, or size of fan blades 317 according to various embodiments. Blower fan 315 may utilize a blower fan motor for example of any torque capacity and speed capacity with varied power requirements. In one example embodiment, a blower fan motor operating at 5 volts, 0.22 amps or 1.1 watts may be used, but the embodiments herein are not limited to such a blower fan motor capacity. In various embodiments and applications of the dual opposite outlet blower fan system of the present disclosures, any level of power for blower fans may be used including from below 1 watt to much greater wattage fans. The fan blades 317 may extend from fan hub and are angled away from the direction of rotation of blower fan 315 in the example embodiment of FIG. 3A. Other embodiments of blade angle and blade shape are shown in other embodiments herein, however, any effective fan blade shape, size, angle, or pitch is contemplated and may be used to move air within the dual opposite outlet blower system of the embodiments of the present disclosure.

The dual opposite outlet blower fan system has an air intake at the aperture 320 in the facing surface of the dual opposite outlet blower system housing to draw air into the dual opposite outlet blower system housing in an embodiment. In other aspects, the air intake to the dual opposite outlet blower system housing may be of any shape and may be situated on either face of the dual opposite outlet blower system housing or even be on a side wall in some embodiments. Further, in some embodiments, the air intake may comprise plural inlets including located on any surface of the dual opposite outlet blower system housing. The dual opposite outlet blower fan system has two outlet apertures 305 and 310. The two outlet apertures 305 and 310 may be opposite one another in one example embodiment such that the flow of air out of the dual opposite outlet blower system housing may happen in generally opposite directions. In one example embodiment, the dual opposite outlet blower fan system may have outlet air movement out of the dual opposite outlet blower system housing in generally opposite directions in a plane of rotation of the blower fan 315. Generally opposite directions of air movement may be anywhere from approximately 120 degrees to approximately 240 degrees in opposite directions. Several degrees outside of the above range is contemplated for some embodiments. The orientation of the outlets relative to each other depends on the desired air flow and pressure that is developed before the next output is reached. If one outlet is less than 120 degrees from the other, the development of airflow and pressure is minimal which limits its usefulness in real application however it still may be a functional embodiment contemplated within the present disclosure for example. Other embodiments, described below, show that the dual outlet apertures may have varied shapes or sizes including one or more curved outlet zones to provide greater airflow out and a wider array of directions from the dual opposite outlet blower system housing.

The dual opposite outlet blower fan system of FIG. 3A and the present disclosure may include two notches, a first notch 330 in side wall 322 and a second notch 332 in side wall 324. First and second notches 330 and 332 may be a curvilinear shape inside of side walls 322 and 324 respectively internal to the dual opposite outlet blower system housing in one example embodiment. The notches 330 and 332 curve from side walls 322 and 324 respectively such that they form a notch angle A 334. The curvilinear shape may increase inward along the side wall 322 or 324 in the direction of rotation (clockwise as depicted) of the blower fan 315 at notch angle A. The curvilinear shape of notches 330 and 332 then recede to follow the shape of the circumference of the fan 315 with blades 317. The notch angle A 334 may be anywhere from 30 to 70 degrees depending upon a notch offset L 338 which is offset from an axis of rotation 336 of fan 315 in some optimized embodiments. In other embodiments as described in some embodiments herein, 0 degrees to 90 degrees may be used. There may be no notches 330 and 332 as shown in an embodiment below, or notches 330 and 320 may be of a variety of shapes including angled, pointed, squared off at 90 degrees, or the like in various embodiments. The notch angle A 334 and notch offset L 338 may define the shape and how far notches 330 and 337 extend from side walls 322 and 324. Further differing shapes of notches 330 and 332 may provide less or greater resistance and air pressurization capability for fan 315 within the dual opposite outlet blower system housing or may yield additional noise whereby a shape or notch size may be determined based upon such factors. Other notch shapes are contemplated for notches 330 and 332 including angled notches with pointed extensions or rounded extensions, rounded notches, wavy notches, or notches of a variety of shapes or contours. In other embodiments, rotation of the fan blades may be counter-clockwise instead of clockwise as shown. Such reversed direction of the rotation of the blower fan 315 may result in changed placement of notches 330 and 332 in some embodiments.

It may be noted with the dual opposite outlet blower fan system of FIG. 3A, the fan diameter 319 may occupy substantially larger portion of the width of dual opposite outlet blower system housing 326. It has been found that an increase of 35% to 55% of fan size is possible compared with conventional blower fans such that the fan and blade diameter Db may be anywhere from approximately 70% to just less than the width of the dual opposite outlet blower system housing. Blade diameter Db less than 70% will also work in some embodiments with the dual opposite outlet blower design. Embodiments with blade diameter DB as low as 60% are contemplated for the various dual opposite outlet blower fan systems of the embodiments herein. With the dual opposite outlet blower fan system, air is not trapped within the pressurization area formed starting from notches 330 and 332 as the fan rotates clockwise in FIG. 3A. Areas 331 and 333 work along with the nearby areas of outlet apertures 305 and 310 respectively to provide air volume build up space without a need to maintain additional dual opposite outlet blower system housing width as with conventional fan systems. In testing, it was found that the dual opposite outlet blower fan system may provide substantial increases in both airflow and pressure compared to a conventional blower system. In one example testing environment with similar fan case width and thickness, similar fan hub diameter, and similar fan speed, the dual opposite outlet blower fan system having a fan blade diameter approximately 93% of the dual opposite outlet blower system housing width compared to a conventional fan having a fan blade diameter at or below 70% of the fan case width could produce more than double the maximum airflow and 50% greater maximum air pressure generated. Thus, improvement in function of the dual opposite outlet blower fan system for moving air may be obtained without sacrificing size or chassis occupancy by the dual opposite outlet blower system housing within an information handling system. In another aspect, the same level of function for moving air may be achieved by a smaller form dual opposite outlet blower fan than a contemporary blower fan freeing up space within the information handling system chassis for other components to occupy or providing further flexibility in layout and location of components within a chassis of an information handling system.

Figure 3B:
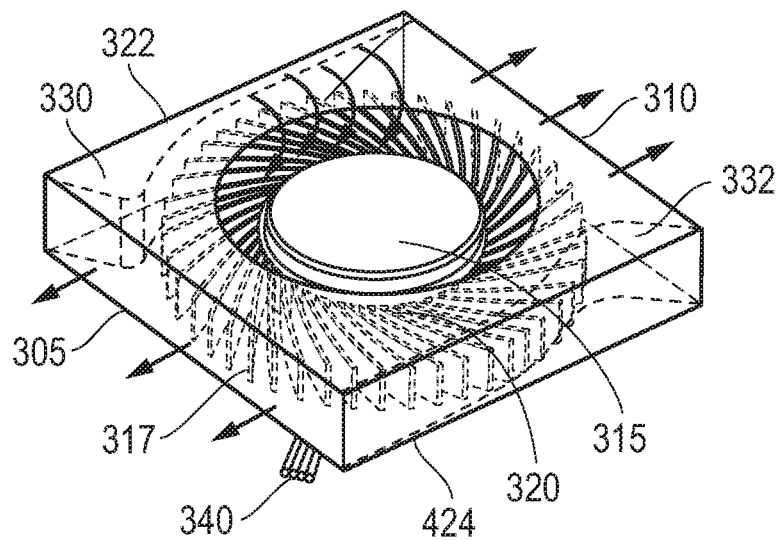
FIG. 3B is a perspective view of a blower with dual opposite outlets according to an embodiment of the present disclosure.

FIG. 3B shows a perspective view of a dual opposite outlet blower fan system, similar to the embodiment of FIG. 3A, according to an embodiment of the present disclosure. Again, dual opposite outlet blower system housing with side wall 322 and 324 is depicted such that elements within the dual opposite outlet blower system housing may be viewed internally. Dual opposite outlet blower system housing may have a width Df between side walls 322 and 324 such that the width Df is the width of the dual opposite outlet blower system housing as taken across the diameter Db of blower fan 315 according to an embodiment. In the example, the width Df of the dual opposite outlet blower system housing does not include the internal protrusion of side wall notches 330 or 332. Blower fan 315 may include a blower fan hub and fan blades 317 extending from the fan hub that may rotate clockwise about a rotation axis. Blower fan 315 is powered by power source 340 which may power and control a blower fan motor. Power source 340 may be operatively connected to a power management system of an information handling system and supply power from a battery power source, an alternating current power source, or other power sources to a blower fan motor (not shown) in various embodiments. Power source 340 may also include one or more control lines to blower fan 315.

Blower fan 315 may have a blade diameter Db that is nearer to the width Df of dual opposite outlet blower system housing between side walls 322 and 324 as described. In various example embodiments, the dual opposite outlet blower system housing of the embodiments of the present disclosure may enable the blower fan diameter Db to occupy greater than 70% of the width Df of the dual opposite outlet blower system housing between side walls 322 and 324. In other embodiments, the blower fan diameter Db may be just short of the width Df of the dual opposite outlet blower system housing such that the fan blades 317 to on contact the dual opposite outlet blower system housing. If the blower fan diameter Db were the same as the width Df of the dual opposite outlet, contact between fan blades 317 and the dual opposite outlet blower system housing side walls 322 or 324 presumably may cause risk of damage. Thus, this limit (<100%) is the limit of the diameter Db of the blower fan 315 with respect to the width of the dual opposite outlet blower system housing between side walls 322 and 324. In some embodiments, an extension of side walls 322 and 324 to accommodate a greater diameter Db of the blower fan 315.

In the example embodiment shown in FIG. 3B, the fan blades 317 extend from the fan hub and are angled away from the direction of rotation of blower fan 315. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system has an air inlet at the aperture 320 in the facing surface of the dual opposite outlet blower system housing to draw air into the dual opposite outlet blower system housing in an embodiment. In other aspects, the air inlet to the dual opposite outlet blower system housing may be plural air inlet apertures or may be of any shape and may be situated on either face of the dual opposite outlet blower system housing or even include an air inlet aperture to be on a side wall in some embodiments. The dual opposite outlet blower fan system has two outlet apertures 305 and 310. The two outlet apertures may be opposite one another in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions.

The dual opposite outlet blower fan system of FIG. 3B and the present disclosure may include two notches, a first notch 330 extending internally from side wall 322 and a second notch 332 extending internally from side wall 324. First and second notches 330 and 332 may be a curvilinear shape inside of side walls 322 and 324 respectively and internal to the dual opposite outlet blower system housing. The notches 330 and 332 curve from outlet apertures 305 and 310 along side walls 322 and 324 respectively such that they form a notch angle A as described with respect to FIG. 3A. The curvilinear shape may increase along the side wall 322 or 324 in the direction of rotation (clockwise as depicted) of the blower fan 315 and then recede to follow the shape of the circumference of the fan 315 with blades 317. The notches 330 and 332 are at least partially in the plane of rotation of the blower fan 315. The notch angle A may be anywhere from 30 to 70 degrees and may also depend upon a notch offset L which is offset from an axis of rotation of fan 315. The notches 330 and 332 extend from side walls 322 and 324 to varying degrees in some embodiments to determine the level of generated air pressure desired or to determine allowable levels of noise during operation. Design of the extension of notches 330 and 332 around the blower fan 315 blade diameter may involve various considerations among tradeoffs between air flow, air pressurization, and operational noise such that notches 330 and 332 may vary in size or shape in multiple variations on the embodiments herein. Notches 330 and 332 may be of a variety of shapes in addition to curvilinear such as angled, pointed, rounded, wavy, or other shapes according to embodiments herein.

It may be noted with the dual opposite outlet blower fan system of FIG. 3B, the fan diameter 319 may occupy substantially larger portion of the width of dual opposite outlet blower system housing 326. It has been found that an increase of 35% to 55% of fan size is possible. As described in embodiments herein the fan and blade diameter Db may be anywhere from 70% to just less than the width of the dual opposite outlet blower system housing. With the dual opposite outlet blower fan system, air is not trapped within the pressurization area formed starting from notches 330 and 332 as the fan rotates clockwise due to the open areas by the blower outlet apertures 305 and 310 on either side of the blower fan 315 in its plane of rotation. Accordingly, improvement in function of the dual opposite outlet blower fan system for moving air over previous blower systems may be obtained without sacrificing size or chassis occupancy by the dual opposite outlet blower system housing within an information handling system.

Figure 3C:
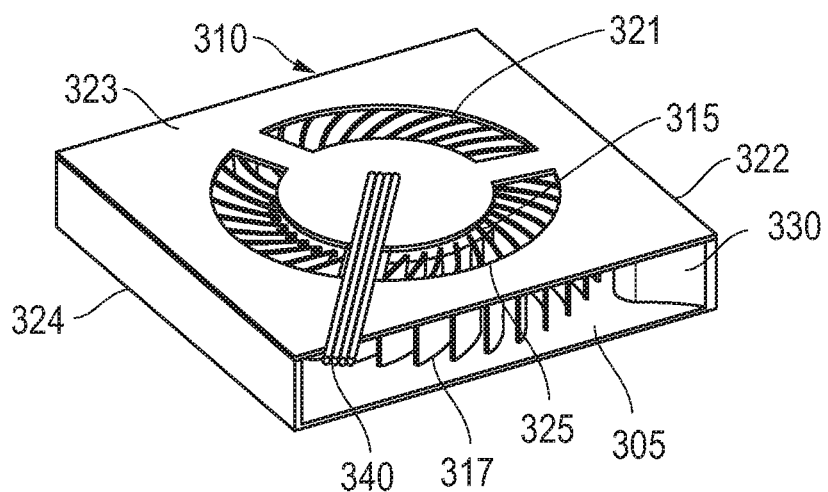
FIG. 3C is a perspective view of a blower with dual opposite outlets and plural inlets according to an embodiment of the present disclosure.

FIG. 3C shows a perspective view of a dual opposite outlet blower fan system which is a variation to the embodiment of FIG. 3A according to an embodiment of the present disclosure. Again, dual opposite outlet blower system housing has side wall 322 and 324 with a width Df between side walls 322 and 324 such that the width Df is the width of the dual opposite outlet blower system housing as taken across the diameter Db of blower fan 315 including the extension of fan blades 317 rotating around a fan hub according to an embodiment. In the example, the width Df of the dual opposite outlet blower system housing does not include the internal protrusion of side wall notches, such as 330 seen through blower outlet 305. The fan blades 317 extend from the fan hub and are angled away from the direction of rotation of blower fan 315, but other embodiments of blade angle and blade shape are contemplated such that any effective fan blade shape, size, angle or pitch is contemplated and may be used to move air within the dual opposite outlet blower of the embodiments within the present disclosure.

Blower fan 315 is powered by power source 340 which may power and control a blower fan motor. Power source 340 may be operatively connected to a power management system of an information handling system and supply power from a battery power source, an alternating current power source, or other power sources to a blower fan motor (not shown) in various embodiments. Power source 340 may also include one or more control lines to blower fan 315.

Blower fan 315 may have a blade diameter Db that is nearer to the width Df of dual opposite outlet blower system housing between side walls 322 and 324 as described. In various example embodiments, the dual opposite outlet blower system housing of the embodiments of the present disclosure may enable the blower fan diameter Db to occupy greater than 70% of the width Df of the dual opposite outlet blower system housing between side walls 322 and 324. In other embodiments, the blower fan diameter Db may be just short of the width Df of the dual opposite outlet blower system housing such that the fan blades 317 to on contact the dual opposite outlet blower system housing. Variations of the housing and notches, such as an extension of side walls 322 and 324 to accommodate a greater diameter Db of the blower fan 315, are contemplated in view of various embodiments herein.

The dual opposite outlet blower fan system has a plurality of air inlets at the apertures 321, 323, and 325 in the facing surface of the dual opposite outlet blower system housing to draw air into the dual opposite outlet blower system housing in an embodiment. In other aspects, the air inlet or inlets 321, 323, and 325 to the dual opposite outlet blower system housing may be of any shape and may be situated on either face of the dual opposite outlet blower system housing or even include an air inlet aperture to be on a side wall in some embodiments. In the presently shown embodiment, the plural air inlets 321, 323, and 325 are shown on a facing surface sharing the power source lines 340. The shown facing surface in the embodiment of FIG. 3C may be the surface of the housing on which the blower fan 315 may be mounted in an embodiment. The dual opposite outlet blower fan system has two outlet apertures 305 and 310 as with other embodiments. The two outlet apertures may be opposite one another in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. The dual opposite outlet blower fan system of FIG. 3C may operate similarly to several embodiments herein to cause air volume and pressure to be forced to exit both outlets 305 and 310.

Figure 3D:
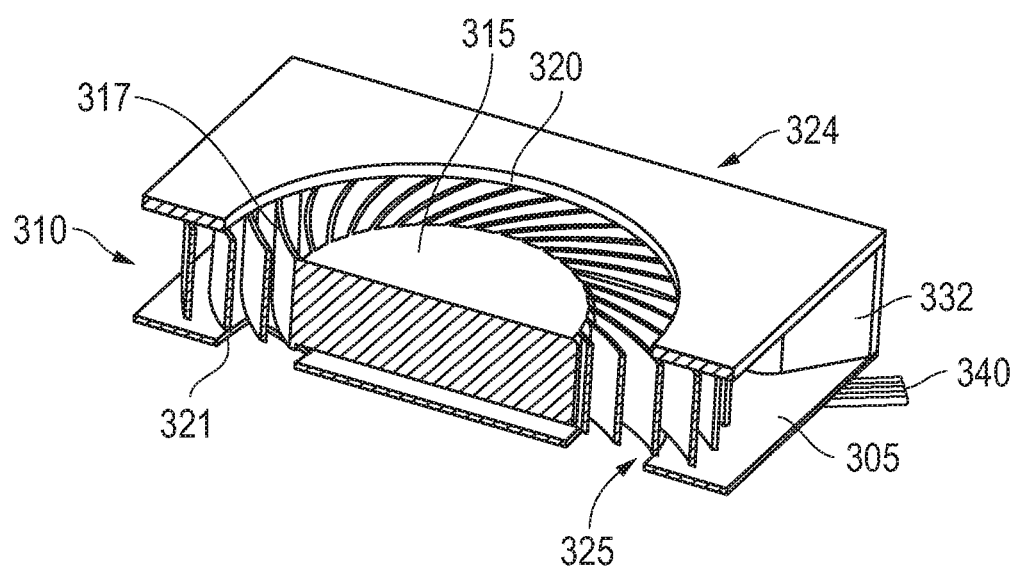
FIG. 3D is a cut-away perspective view of a blower with dual opposite outlets and plural inlets according to another embodiment of the present disclosure.

FIG. 3D shows a perspective cut-away view of a dual opposite outlet blower fan system which is a variation to the embodiment of FIG. 3A according to an embodiment of the present disclosure. Again, dual opposite outlet blower system housing has side wall 322 and 324 with a width Df between side walls 322 and 324 such that the width Df is the width of the dual opposite outlet blower system housing as taken across the diameter Db of blower fan 315 including the extension of fan blades 317 rotating around a fan hub according to an embodiment. In the example, the width Df of the dual opposite outlet blower system housing does not include the internal protrusion of side wall notches, such as 332 seen through blower outlet 305. The fan blades 317 extend from the fan hub and are angled away from the direction of rotation of blower fan 315, but other embodiments of blade angle and blade shape are contemplated such that any effective fan blade shape, size, angle or pitch is contemplated and may be used to move air within the dual opposite outlet blower of the embodiments within the present disclosure.

Blower fan 315 is powered by power source 340 which may power and control a blower fan motor. Power source 340 may also include one or more control lines to blower fan 315. Further, blower fan 315 may have a blade diameter Db that is nearer to the width Df of dual opposite outlet blower system housing between side walls 322 and 324 as described in several embodiments herein.

The dual opposite outlet blower fan system has a plurality of air inlets at the apertures 320 on the facing surface and at apertures 321 and 325 in the bottom surface of the dual opposite outlet blower system housing shown to draw air into the dual opposite outlet blower system housing in an embodiment. In other aspects, any combination of air inlet or inlets 320, 321, or 325 to the dual opposite outlet blower system housing may be used in either the facing surface or bottom surface of the dual opposite outlet blower fan housing. Further, the air inlets may be of any shape and on either face of the dual opposite outlet blower system housing or even include an air inlet aperture to be on a side wall in some embodiments. In the presently shown embodiment, the cut-away is intended to illustrate the plural air inlets 320, 321, and 325 on opposite surfaces of the dual opposite outlet blower fan housing in the embodiment of FIG. 3D. The dual opposite outlet blower fan system has two outlet apertures 305 and 310 as with other embodiments. The two outlet apertures may be opposite one another in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. The dual opposite outlet blower fan system of FIG. 3D may operate similarly to several embodiments herein to cause air volume and pressure to be forced to exit both outlets 305 and 310.

Figure 3E:
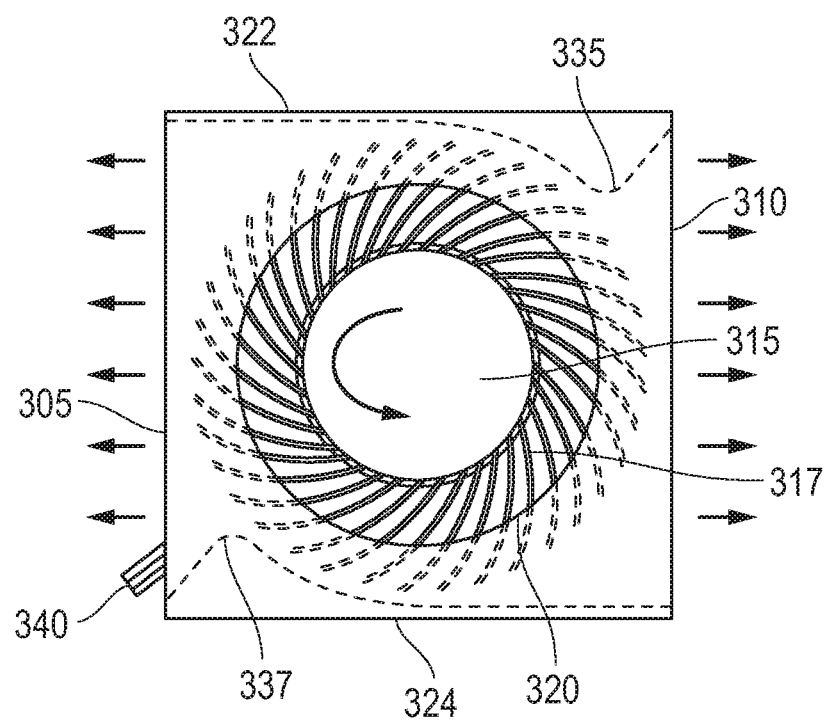
FIG. 3E is a top view of a blower with dual opposite outlets and counterclockwise fan rotation according to an embodiment of the present disclosure.

FIG. 3E shows a top view of a dual opposite outlet blower fan system which is a variation to the embodiment of FIG. 3A according to an embodiment of the present disclosure. In this particular embodiment, a counterclockwise fan rotation may be used. Again, dual opposite outlet blower system housing has side wall 322 and 324 with a width Df between side walls 322 and 324 such that the width Df is the width of the dual opposite outlet blower system housing as taken across the diameter Db of blower fan 315 including the extension of fan blades 317 rotating around a fan hub according to an embodiment. In the example, the width Df of the dual opposite outlet blower system housing does not include the internal protrusion of side wall notches 335 and 337. Due to the opposite rotation of fan 315 and blades 317, notches 335 and 337 are situated in a different location along side walls 322 and 324 respectively relative to fan 315 and blades 317. The fan blades 317 extend from the fan hub and are angled away from the direction of rotation of blower fan 315, but other embodiments of blade angle and blade shape are contemplated such that any effective fan blade shape, size, angle or pitch is contemplated and may be used to move air within the dual opposite outlet blower of the embodiments within the present disclosure.

Blower fan 315 is powered by power source 340 which may power and control a blower fan motor. Power source 340 may also include one or more control lines to blower fan 315. Further, blower fan 315 may have a blade diameter Db that is nearer to the width Df of dual opposite outlet blower system housing between side walls 322 and 324 as described in several embodiments herein.

The dual opposite outlet blower fan system has an air inlet at aperture 320 on the facing surface however a plurality of air inlets are contemplated as described in various embodiments. Further, the air inlets may be of any shape and on either face of the dual opposite outlet blower system housing or even include an air inlet aperture to be on a side wall in some embodiments. The dual opposite outlet blower fan system has two outlet apertures 305 and 310 as with other embodiments. The two outlet apertures may be opposite one another in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. The dual opposite outlet blower fan system of FIG. 3E may operate similarly to several embodiments herein to cause air volume and pressure to be forced to exit both outlets 305 and 310.

Figure 4:
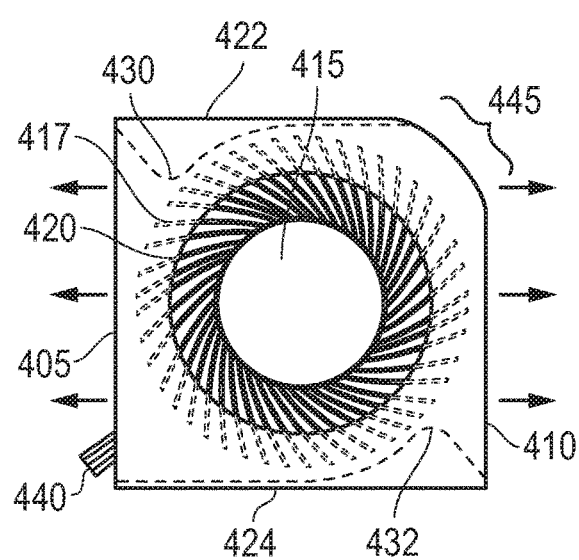
FIG. 4 is a top view of a blower with dual opposite outlets according to another embodiment of the present disclosure.

FIG. 4 shows a top view of a dual opposite outlet blower fan system according to another embodiment of the present disclosure. Again, a dual opposite outlet blower system housing with side walls 422 and 424 is depicted such that elements within the dual opposite outlet blower system housing may be viewed internally. Dual opposite outlet blower system housing may have a width Df between side walls 422 and 424 in an example embodiment such that the width Df is the width of the dual opposite outlet blower system housing as taken across the diameter Db of blower fan 415 according to an embodiment. In an example, the width Df of the dual opposite outlet blower system housing does not include the internal protrusion of side wall notches 430 or 432. Blower fan 415 may include a blower fan hub and fan blades 417 extending from the fan hub that may rotate clockwise about a rotation axis. Blower fan 415 is powered by power source 440 which may power and control a blower fan motor. Power source 440 may be operatively connected to a power management system of an information handling system and supply power from a battery power source, an alternating current power source, or other power sources to a blower fan motor (not shown) in various embodiments. Power source 440 may also include one or more control lines to blower fan 415.

Blower fan 415 may have a blade diameter Db that is nearer to the described width Df of dual opposite outlet blower system housing between side walls 422 and 424 than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 422 and 424. As described in embodiments herein the fan and blade diameter Db may be anywhere from 70% to just less than the width of the dual opposite outlet blower system housing. With the dual opposite outlet blower fan system, air is not trapped within the pressurization area formed along side wall notches 430 and 432 as the fan rotates clockwise due to the open areas by the blower outlet apertures 405 and 410 on either side of the blower fan 415 in its plane of rotation. Accordingly, improvement in function of the dual opposite outlet blower fan system for moving air over previous blower systems may be obtained without sacrificing size or chassis occupancy by the dual opposite outlet blower system housing within an information handling system.

In the example embodiment shown in FIG. 4, the fan blades 417 extend from the fan hub and are angled away from the direction of rotation of blower fan 415. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 4 includes two notches, a first notch 430 extending internally from side wall 422 and a second notch 432 extending internally from side wall 424. First and second notches 430 and 432 may be a curvilinear shape inside of side walls 422 and 424 respectively internal to the dual opposite outlet blower system housing. The notches 430 and 432 curve from outlet apertures 405 and 410 and along side walls 422 and 424 respectively such that they form a notch angle A as described with respect to FIG. 3A. The curvilinear shape may increase and then decrease along the side wall 422 or 424 in the direction of rotation (clockwise as depicted) of the blower fan 415 such that it may follow the shape of the circumference of the fan 415 with blades 417. The notch angle A may be anywhere from 30 to 70 degrees and also depend upon a notch offset L which is offset from an axis of rotation of fan 415. The notches 430 and 432 extend from side walls 422 and 424 to varying degrees in some embodiments to determine the level of generated air pressure desired or to determine allowable levels of noise during operation. Design of the extension of notches 430 and 432 around the blower fan 415 blade diameter may be a trade off between greater resistance and air pressurization capability for the dual opposite outlet blower system versus operational noise. Notches 430 and 432 may be of a variety of shapes in addition to curvilinear such as angled, pointed, rounded, wavy, or other shapes according to other embodiments herein.

The dual opposite outlet blower fan system has an air inlet at the aperture 420 in the facing surface of the dual opposite outlet blower system housing to draw air into the dual opposite outlet blower system housing in an embodiment. In other aspects, the air intake to the dual opposite outlet blower system housing may be plural air inlet apertures or may be of any shape. The air inlet aperture 420 may be situated on either face of the dual opposite outlet blower system housing or even include an air inlet aperture to be on a side wall in some embodiments. The dual opposite outlet blower fan system has two outlet apertures 405 and 410. The two outlets may be opposite one another in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. In the current embodiment of FIG. 4, the dual outlet apertures may have varied shapes. The embodiment of FIG. 4 has at least one curved aperture outlet zone 445 to provide a wider directionality to airflow out from the dual opposite outlet blower system housing at outlet aperture 410. It is also contemplated that outlet aperture 405 may also have one or more curved aperture outlet zones as shown in FIG. 5.

Figure 5:
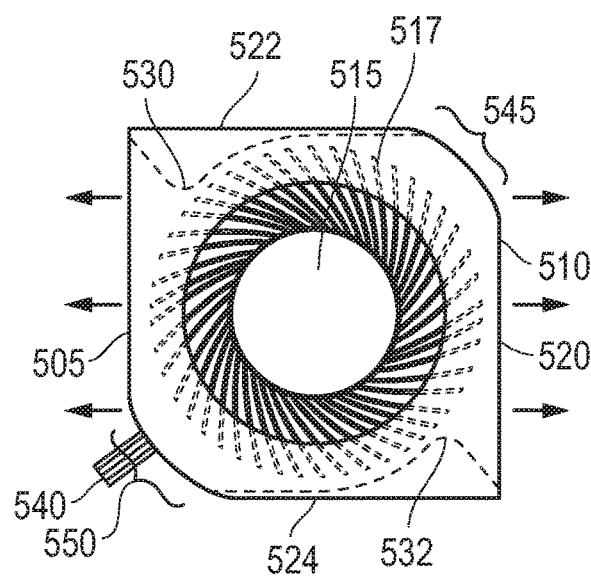
FIG. 5 is a top view of a blower with dual opposite outlets according to another embodiment of the present disclosure.

FIG. 5 shows a top view of a dual opposite outlet blower fan system according to another embodiment of the present disclosure. FIG. 5 is a similar embodiment to that described in FIG. 4. Again, a dual opposite outlet blower system housing with side walls 522 and 524 is depicted such that elements within the dual opposite outlet blower system housing may be viewed internally. Dual opposite outlet blower system housing may have a width Df between side walls 522 and 524 in an example embodiment such that the width Df is the width of the dual opposite outlet blower system housing as taken across the diameter Db of blower fan 415 according to an embodiment. Blower fan 515 may have a blade diameter Db that is nearer to the described width Df of dual opposite outlet blower system housing between side walls 522 and 524 than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 522 and 524. As described in embodiments herein the fan and blade diameter Db may be anywhere from 70% to just less than the width of the dual opposite outlet blower system housing. Accordingly, improvement in function of the dual opposite outlet blower fan system for moving air over previous blower systems may be obtained without sacrificing size or chassis occupancy as described in the present disclosure.

Blower fan 515 is powered by power source 540 which may power and control a blower fan motor. Power source 540 may be operatively connected to a power management system of an information handling system and supply power from a battery power source, an alternating current power source, or other power sources to a blower fan motor (not shown) in various embodiments. Power source 540 may also include one or more control lines to blower fan 515.

In the example embodiment shown in FIG. 5, the fan blades 517 extend from the fan hub and are angled away from the direction of rotation of blower fan 515. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 5 includes two notches, a first notch 530 extending internally from side wall 522 and a second notch 532 extending internally from side wall 524. First and second notches 530 and 532 may be a curvilinear shape inside of side walls 522 and 524 respectively and internal to the dual opposite outlet blower system housing as described in various embodiments herein. The extension of the notches 530 and 532 from side walls 522 and 524 may vary depending on desired pressurization desired and noise minimization desired. A notch angle A as described with respect to FIG. 3A may determine the degree of curvature of the curvilinear shape of the notches 530 and 532 as described with embodiments herein. Notches 530 and 532 may be of a variety of shapes in addition to curvilinear such as angled, pointed, rounded, wavy, or other shapes according to other embodiments herein.

The dual opposite outlet blower fan system has an air inlet at the aperture 520 in the facing surface of the dual opposite outlet blower system housing to draw air into the dual opposite outlet blower system housing in an embodiment. In other aspects, the air intake to the dual opposite outlet blower system housing may be plural air inlet apertures, may be of any shape, or may be disposed on either face of the dual opposite outlet blower system housing or even on a side wall in some embodiments as described herein.

The dual opposite outlet blower fan system has two outlet apertures 505 and 510. The two outlets may be opposite one another in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. In the current embodiment of FIG. 5, the dual outlet apertures may have varied shapes. The embodiment of FIG. 5 illustrates a first curved aperture outlet zone 545 to provide a wider directionality to airflow out from the dual opposite outlet blower system housing at outlet aperture 510. The embodiment of FIG. 5 also illustrates a second curved aperture outlet zone 550 to provide greater airflow and directionality as from outlet aperture 505 as shown in FIG. 5.

Figure 6:
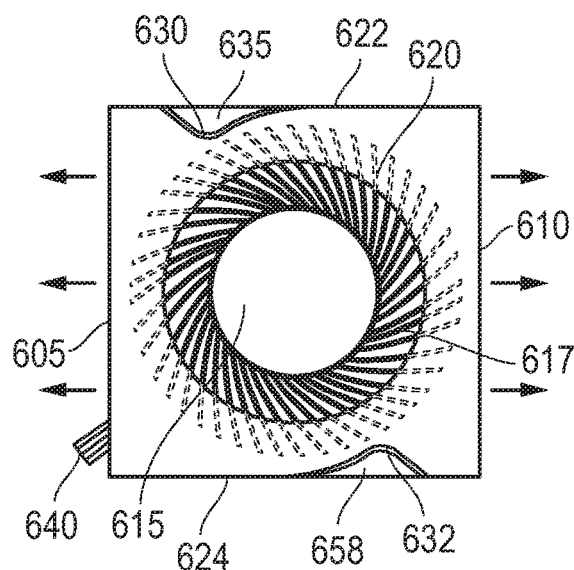
FIG. 6 is a top view of a blower with dual opposite outlets according to another embodiment of the present disclosure.

FIG. 6 shows a top view of a dual opposite outlet blower fan system according to another embodiment of the present disclosure. FIG. 6 is similar to embodiments described above and is depicted such that elements within the dual opposite outlet blower system housing may be viewed internally. The dual opposite outlet blower fan system includes a blower fan 615 and a dual opposite outlet blower system housing with side walls 622 and 624, a facing surface including an air inlet at aperture 620 to draw air into the dual opposite outlet blower system housing in an embodiment. The dual opposite outlet blower fan system has two outlet apertures 605 and 610. The two outlet apertures may be opposite one another in a plane of rotation of blower fan 615 in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air intake to the dual opposite outlet blower system housing may be plural air inlet apertures, may be of any shape, or may be disposed on either face of the dual opposite outlet blower system housing or even on a side wall in some embodiments as described herein.

Fan blades 617 extend from the fan hub and are angled away from the direction of rotation of blower fan 615 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 6 includes two notches 630 and 632. A first notch 630 is formed of the side wall 622 and extends internally into the dual opposite outlet blower fan system housing. A gap 655 formed of an indentation along the exterior of side wall 622 at notch 630 shows the dual opposite outlet blower fan system housing base in an embodiment. It is understood that only a gap 655 formed of the indentation, and no base underneath, may be present in other embodiments. A second notch 632 is formed of the side wall 624 and extends internally into the dual opposite outlet blower fan system housing. Similarly, a gap 658 formed of an indentation along the exterior of side wall 624 at notch 632 shows the dual opposite outlet blower fan system housing base in an embodiment. It is understood that only a gap 658 formed of the indentation, and no base, may be present in some other embodiments. First and second notches 630 and 632 with gaps 655 and 658 may provide additional space in a chassis of an information handling system. First and second notches 630 and 632 may be formed of a curvilinear shape from side walls 622 and 624 respectively as described in various embodiments herein. The internal extension of the notches 630 and 632 of side walls 622 and 624 may vary depending on desired pressurization or noise minimization. This internal extension may be determined based on considerations described in embodiments herein including a notch angle A and an offset as described with respect to FIG. 3A. In various other embodiments, notches 630 and 632 may be of a variety of shapes including angled, pointed, rounded, wavy, or other shaped notches according to other embodiments herein.

Blower fan 615 is powered by power source 640 which may power and control a blower fan motor. Power source 640 may be operatively connected to a power management system of an information handling system and supply power from a battery power source, an alternating current power source, or other power sources to a blower fan motor (not shown) in various embodiments. Power source 640 may also include one or more control lines to blower fan 615.

As described with various embodiments herein, the dual opposite outlet blower system housing may have a width Df between side walls 622 and 624 in an example embodiment such that the width Df is the width of the dual opposite outlet blower system housing as taken across the diameter Db of blower fan 615 according to an embodiment. Blower fan 615 may have a blade diameter Db that is nearer to the described width Df of dual opposite outlet blower system housing between side walls 622 and 624 than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 622 and 624 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

FIG. 6 shows a top view of a dual opposite outlet blower fan system according to another embodiment of the present disclosure. FIG. 6 is similar to embodiments described above and is depicted such that elements within the dual opposite outlet blower system housing may be viewed internally. The dual opposite outlet blower fan system includes a blower fan 615 and a dual opposite outlet blower system housing with side walls 622 and 624, a facing surface including an air inlet at aperture 620 to draw air into the dual opposite outlet blower system housing in an embodiment. The dual opposite outlet blower fan system has two outlet apertures 605 and 610. The two outlet apertures may be opposite one another in a plane of rotation of blower fan 615 in one example embodiment such that the flow of air out of the dual opposite outlet blower system housing may happen in generally opposite directions. In one example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air intake to the dual opposite outlet blower system housing may be plural air inlet apertures, may be of any shape, or may be disposed on either face of the dual opposite outlet blower system housing or even on a side wall in some embodiments as described herein.

Fan blades 617 extend from the fan hub and are angled away from the direction of rotation of blower fan 615 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 6 includes two notches 630 and 632. A first notch 630 is formed of the side wall 622 and extends internally into the dual opposite outlet blower fan system housing. First notch 630 of side wall 622 as shown extends beginning internal to outlet aperture 605 in an embodiment, and extends a lesser amount into the dual opposite blower fan system housing than other embodiments. A gap 655 formed via an indentation along the exterior of side wall 622 corresponding to notch 630 shows the dual opposite outlet blower fan system housing base in an embodiment. Is understood that only a gap 655 formed of the indentation, and no base underneath, may be present in other embodiments. A second notch 632 is formed of the side wall 624 and extends internally into the dual opposite outlet blower fan system housing. Second notch 632 of side wall 624 extends beginning internal to outlet aperture 610 in an embodiment, and extends a lesser amount into the dual opposite blower fan system housing as well. Similarly, a gap 658 formed of an indentation along the exterior of side wall 624 corresponding to notch 632 shows the dual opposite outlet blower fan system housing base in an embodiment. It is understood that only a gap 658 formed of the indentation, and no exposed base, may be present in some other embodiments. First and second notches 630 and 632 with gaps 655 and 658 may provide additional space in a chassis of an information handling system. First and second notches 630 and 632 may be formed of a curvilinear shape from side walls 622 and 624 respectively as described in various embodiments herein. The internal extension of the notches 630 and 632 of side walls 622 and 624 may vary depending on desired pressurization and noise minimization. This internal extension may be determined based on considerations described in embodiments herein including a notch angle A and an offset as described with respect to FIG. 3A. In various other embodiments, notches 630 and 632 may be of a variety of shapes including angled, pointed, rounded, wavy, or other shaped notches according to other embodiments herein.

Blower fan 615 is powered by power source 640 which may power and control a blower fan motor. Power source 640 may be operatively connected to a power management system of an information handling system and supply power from a battery power source, an alternating current power source, or other power sources to a blower fan motor (not shown) in various embodiments. Power source 640 may also include one or more control lines to blower fan 615.

Figure 7:
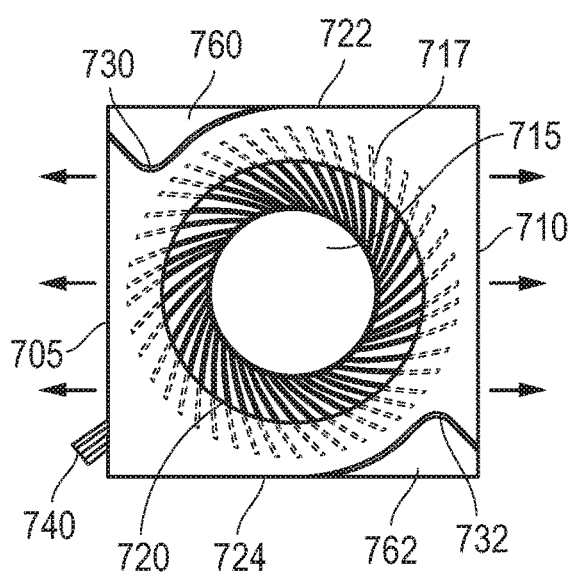
FIG. 7 is a top view of a blower with dual opposite outlets according to another embodiment of the present disclosure.

FIG. 7 shows a top view of a dual opposite outlet blower fan system according to another embodiment of the present disclosure. FIG. 7 is similar to embodiments described above and is depicted such that elements within the dual opposite outlet blower system housing may be viewed internally. The dual opposite outlet blower fan system includes a blower fan 715 and a dual opposite outlet blower system housing with side walls 722 and 724, a facing surface including an air inlet at aperture 720 to draw air into the dual opposite outlet blower system housing in an embodiment. The dual opposite outlet blower fan system has two outlet apertures 705 and 710. The two outlet apertures may be opposite one another in a plane of rotation of blower fan 715 in one embodiment such that the flow of air out of the dual opposite outlet blower system housing may happen in generally opposite directions. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 720 to the dual opposite outlet blower system housing may be plural air inlet apertures, may be of any shape, or may be disposed on either face of the dual opposite outlet blower system housing or even on a side wall in some embodiments as described herein.

Fan blades 717 extend from the fan hub and are angled away from the direction of rotation of blower fan 715 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 7 includes two notches 730 and 732. A first notch 730 is formed of the side wall 722 and extends internally into the dual opposite outlet blower fan system housing. First notch 730 of side wall 722 begins a curvilinear shape at the first aperture 705, curves inward, and gradually recedes along the diameter of blower fan 715 in the direction of rotation of fan 715 toward second outlet aperture 710. A gap 760 formed via an indentation along the exterior of side wall 722 corresponding to notch 730 shows the dual opposite outlet blower fan system housing base underlying in an embodiment. It is understood that only a gap 760, and no exposed base underneath, may be present in some embodiments. First notch 730 is formed of side wall 722 such that outlet aperture 705 is narrower than the width Df of the dual opposite outlet blower fan system housing as taken between sidewalls 722 and 724 and accommodating the diameter Db of fan 715 and blades 717. A second notch 732 is formed of the side wall 724 and extends internally into the dual opposite outlet blower fan system housing. Similarly, a gap 762 formed via an indentation along the exterior of side wall 724 corresponding to notch 732 shows the dual opposite outlet blower fan system housing underlying base in an embodiment. It is understood that only a gap 762 formed via the indentation, and no underlying base, may be present in some other embodiments. Second notch 732 is formed of side wall 724 such that outlet aperture 710 is also narrower than the width Df of the dual opposite outlet blower fan system housing as taken between sidewalls 722 and 724 and accommodating the diameter Db of fan 715 and blades 717. First and second notches 730 and 732 with gaps 760 and 762 may provide additional space in a chassis of an information handling system. First and second notches 730 and 732 may be formed of a curvilinear shape from side walls 722 and 724 respectively as described in various embodiments herein. The internal extension of the notches 730 and 732 of side walls 722 and 724 may vary depending on desired pressurization and noise minimization. This internal extension may be determined based on considerations described in embodiments herein including a notch angle A to a point outside of the outlet apertures 705 and 710, and an offset as described with respect to FIG. 3A. In various other embodiments, notches 730 and 732 may be of a variety of shapes including angled, pointed, rounded, wavy, or other shaped notches according to other embodiments herein.

Blower fan 715 is powered by power source 740 which may power and control a blower fan motor. Power source 740 may be operatively connected to a power management system of an information handling system and supply power from a battery power source, an alternating current power source, or other power sources to a blower fan motor (not shown) in various embodiments. Power source 740 may also include one or more control lines to blower fan 715.

As described with various embodiments herein, the dual opposite outlet blower system housing may have a width Df between side walls 722 and 724 in an example embodiment such that the width Df is the width of the dual opposite outlet blower system housing as taken across the diameter Db of blower fan 715 according to an embodiment. Blower fan 715 may have a blade diameter Db that is nearer to the width Df of dual opposite outlet blower system housing between side walls 722 and 724 as described than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 722 and 724 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 8:
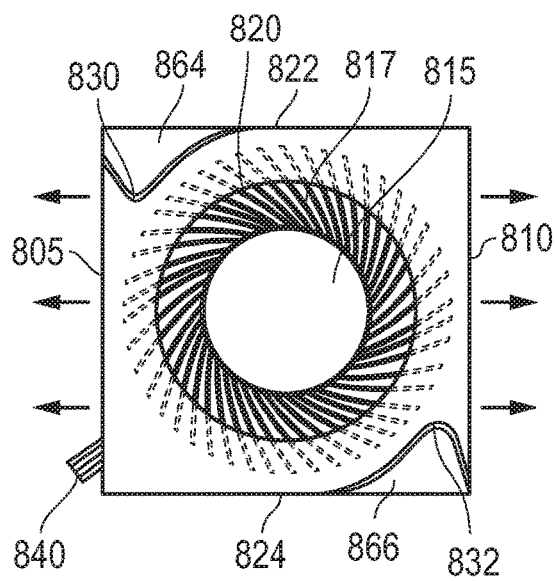
FIG. 8 is a top view of a blower with dual opposite outlets according to another embodiment of the present disclosure.

FIG. 8 shows a top view of a dual opposite outlet blower fan system according to another embodiment of the present disclosure. FIG. 8 is similar to embodiments described above and is depicted such that elements within the dual opposite outlet blower system housing may be viewed internally. The dual opposite outlet blower fan system includes a blower fan 815 and a dual opposite outlet blower system housing with side walls 822 and 824, a facing surface including an air inlet at aperture 820 to draw air into the dual opposite outlet blower system housing in an embodiment.

The dual opposite outlet blower fan system has two outlet apertures 805 and 810. The two outlet apertures may be opposite one another in a plane of rotation of blower fan 815 in one embodiment such that the flow of air out of the dual opposite outlet blower system housing may happen in generally opposite directions. In the shown embodiment of FIG. 8, the outlet apertures may be different dimensions. As shown in the example embodiment, outlet 805 may be narrower than outlet 810 in an example embodiment. This is due to notch 830 forming the edge of the aperture of outlet 805 and notch 832 receding to side wall 824 to form the edge of outlet 810. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 820 to the dual opposite outlet blower system housing may be plural air inlet apertures, may be of any shape, or may be disposed on either face of the dual opposite outlet blower system housing or even on a side wall in some embodiments as described herein.

Fan blades 817 extend from the fan hub and are angled away from the direction of rotation of blower fan 815 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 8 includes two notches 830 and 832. A first notch 830 is formed of the side wall 822 and extends internally into the dual opposite outlet blower fan system housing. First notch 830 of side wall 822 begins a curvilinear shape at the first aperture 805, curves inward, and gradually recedes along the diameter of blower fan 815 in the direction of rotation of fan 815 toward second outlet aperture 810. A gap 864 formed via an indentation along the exterior of side wall 822 corresponding to notch 830 shows the dual opposite outlet blower fan system housing underlying base in an embodiment. It is understood that only a gap 864 formed of the indentation, and no exposed base underneath, may be present in some embodiments. First notch 830 is formed of side wall 822 such that outlet aperture 805 is less than the width Df of the dual opposite outlet blower fan system housing between sidewalls 822 and 824. A second notch 832 is formed of the side wall 824 and extends internally into the dual opposite outlet blower fan system housing. Similarly, a gap 866 formed via an indentation along the exterior of side wall 824 corresponding to notch 832 shows the dual opposite outlet blower fan system housing base in an embodiment. In other embodiments, only a gap 866 formed of the indentation, and no exposed underlying base, may be present. Second notch 832 is formed of side wall 824 such that outlet aperture 810 is also the same as the width Df of the dual opposite outlet blower fan system housing as taken between sidewalls 822 and 824. First and second notches 830 and 832 with gaps 864 and 866 may provide additional space in a chassis of an information handling system. First and second notches 830 and 832 may be formed of a curvilinear shape from side walls 822 and 824 respectively as described in various embodiments herein. The internal extension of the notches 830 and 832 of side walls 822 and 824 may vary depending on desired pressurization and noise minimization. This internal extension may be determined based on considerations described in embodiments herein including a notch angle A and an offset as described with respect to FIG. 3A. In various other embodiments, notches 830 and 832 may be of a variety of shapes including angled, pointed, rounded, wavy, or other shaped notches according to other embodiments herein.

Blower fan 815 is powered by power source 840 which may power and control a blower fan motor. Power source 840 may be operatively connected to a power management system of an information handling system and supply power from a battery power source, an alternating current power source, or other power sources to a blower fan motor (not shown) in various embodiments. Power source 840 may also include one or more control lines to blower fan 815.

As described with various embodiments herein, the dual opposite outlet blower system housing may have a width Df between side walls 822 and 824 in an example embodiment such that the width Df is the width of the dual opposite outlet blower system housing as taken across the diameter Db of blower fan 815 according to an embodiment. Blower fan 815 may have a blade diameter Db that is nearer to the width Df of dual opposite outlet blower system housing between side walls 822 and 824 as described than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 822 and 824 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 9:
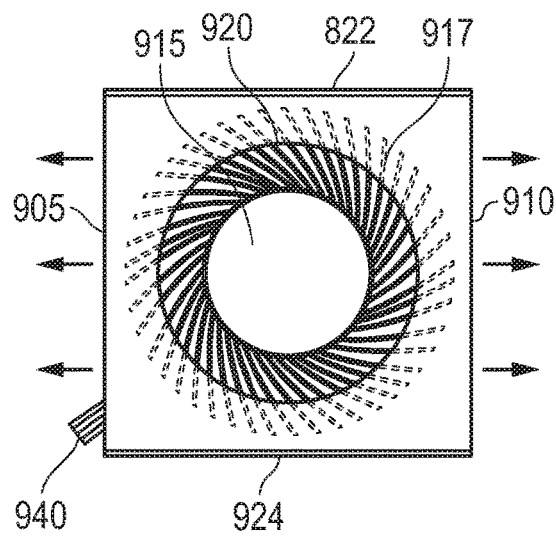
FIG. 9 is a top view of a blower with dual opposite outlets according to another embodiment of the present disclosure.

FIG. 9 shows a top view of a dual opposite outlet blower fan system according to another embodiment of the present disclosure. FIG. 9 is similar to embodiments described above and is depicted such that elements within the dual opposite outlet blower system housing may be viewed internally. The dual opposite outlet blower fan system includes a blower fan 915 and a dual opposite outlet blower system housing with side walls 922 and 924, a facing surface including an air inlet at aperture 920 to draw air into the dual opposite outlet blower system housing in an embodiment. The dual opposite outlet blower fan system has two outlet apertures 905 and 910. The two outlet apertures may be opposite one another in a plane of rotation of blower fan 915 in one embodiment such that the flow of air out of the dual opposite outlet blower system housing may happen in generally opposite directions. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 920 to the dual opposite outlet blower system housing may be plural air inlet apertures, may be of any shape, or may be disposed on either face of the dual opposite outlet blower system housing or even on a side wall in some embodiments as described herein.

Fan blades 917 extend from the fan hub and are angled away from the direction of rotation of blower fan 915 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 9 has no notches in side walls 922 and 924 as with other embodiments. Having no notches may not provide as much of a pressurization zone along side walls 922 and 924 in the plane of rotation of blower fan 915, however a close proximity and tolerance between the diameter Db of the blower fan 915 including fan blades 917 and side walls 922 and 924 may still generate sufficient air pressure in an embodiment to force air to outlet apertures 905 and 910. Such a dual opposite outlet blower fan system without notches may be a cost saving aspect to allow less expensive manufacturing costs of the dual opposite outlet blower fan system.

Blower fan 915 is powered by power source 940 which may power and control a blower fan motor. Power source 940 may be operatively connected to a power management system of an information handling system and supply power from a battery power source, an alternating current power source, or other power sources to a blower fan motor (not shown) in various embodiments. Power source 940 may also include one or more control lines to blower fan 915.

As described with various embodiments herein, the dual opposite outlet blower system housing may have a width Df between side walls 922 and 924 in an example embodiment such that the width Df is the width of the dual opposite outlet blower system housing as taken across the diameter Db of blower fan 915 according to an embodiment. Blower fan 915 may have a blade diameter Db that is nearer to the width Df of dual opposite outlet blower system housing between side walls 922 and 924 as described than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 922 and 924 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 10:
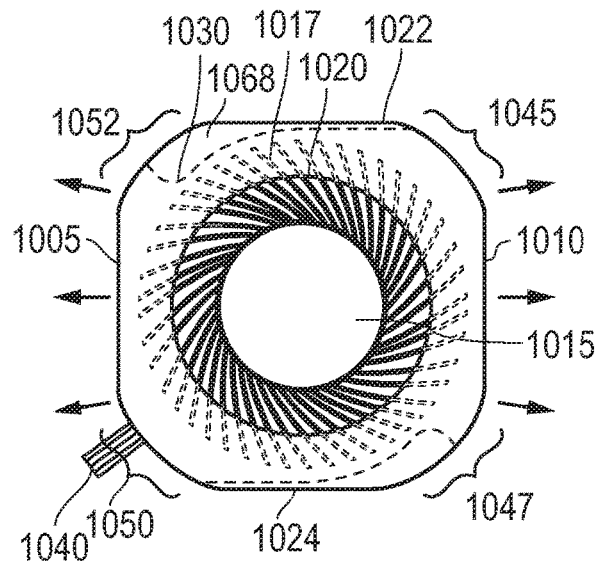
FIG. 10 is a top view of a blower with dual opposite outlets according to another embodiment of the present disclosure.

FIG. 10 shows a top view of a dual opposite outlet blower fan system according to another embodiment of the present disclosure. FIG. 10 is similar to embodiments described above and is depicted such that elements within the dual opposite outlet blower system housing may be viewed internally. The dual opposite outlet blower fan system includes a blower fan 1015 and a dual opposite outlet blower system housing with side walls 1022 and 1024, a facing surface including an air inlet at aperture 1020 to draw air into the dual opposite outlet blower system housing in an embodiment. The dual opposite outlet blower fan system has two outlet apertures 1005 and 1010. The two outlet apertures may be opposite one another in a plane of rotation of blower fan 1015 in one embodiment such that the flow of air out of the dual opposite outlet blower system housing may happen in generally opposite directions. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 1020 to the dual opposite outlet blower system housing may be plural air inlet apertures, may be of any shape, or may be disposed on either face of the dual opposite outlet blower system housing or even on a side wall in some embodiments as described herein.

The two outlet apertures 1005 and 1010 of the current embodiment of FIG. 10 may have varied shapes such as curved aperture zones in the dual opposite outlet apertures. For example, outlet aperture 1010 may have a first curved aperture outlet zone 1045 and a second curved outlet aperture zone 1047 to provide a wider directionality to airflow out from the dual opposite outlet blower system housing at outlet aperture 1010. Similarly, outlet aperture 1005 also has a third curved aperture outlet zone 1050 and a fourth curved aperture outlet zone 1052 to provide greater airflow directionality as from outlet aperture 1005 as shown in FIG. 10. It is understood that curved aperture zones may be curved, angled, or of any suitable shape modifying the dual opposite outlet apertures 1005 and 1010.

Fan blades 1017 extend from the fan hub and are angled away from the direction of rotation of blower fan 1015 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 10 includes two notches 1030 and 1032. A first notch 1030 is formed of the side wall 1022 at the fourth curved aperture zone 1052 and extends internally into the dual opposite outlet blower fan system housing. First notch 1030 of side wall 1022 begins a curvilinear shape at the first aperture 1005 in curved aperture zone 1052, curves inward to the dual opposite outlet blower fan system housing, and gradually recedes along the diameter of blower fan 1015 in the direction of rotation of fan 1015 toward second outlet aperture 1010. A gap 1068 formed via an indentation along the exterior of side wall 1022 corresponding to notch 1030 shows the dual opposite outlet blower fan system housing base in an embodiment. It is understood that only a gap 1068 formed of the indentation, and no exposed base underneath, may be present in some embodiments. First notch 1030 is formed of side wall 1022 such that outlet aperture 1005 is narrower than the width Df of the dual opposite outlet blower fan system housing as taken between sidewalls 1022 and 1024 and accommodating the diameter Db of fan 1015 and blades 1017 in the present embodiment.

A second notch 1032 is formed of the side wall 1024 at the second curved aperture zone 1047 and extends internally into the dual opposite outlet blower fan system housing. Similarly, a gap 1070 formed via an indentation along the exterior of side wall 1024 corresponding to notch 1032 shows the dual opposite outlet blower fan system housing base in an embodiment. It is understood that only a gap 1070 formed of the indentation, and no exposed base underneath, may be present in some embodiments. Second notch 1032 is formed of side wall 1024 such that outlet aperture 1010 is also narrower than the width Df of the dual opposite outlet blower fan system housing as taken between sidewalls 1022 and 1024 and accommodating the diameter Db of fan 1015 and blades 1017 in the shown embodiment.

First and second notches 1030 and 1032 with gaps 1068 and 1070 may provide additional space in a chassis of an information handling system. First and second notches 1030 and 1032 may be formed of a curvilinear shape from side walls 1022 and 1024 respectively as described in various embodiments herein. The internal extension of the notches 1030 and 1032 may vary depending on desired pressurization and noise minimization according to various embodiments described herein and may depend on determination of a notch angle A to a point outside of the outlet apertures 1005 and 1010, and an offset as described with respect to FIG. 3A. In various other embodiments, notches 1030 and 1032 may be of a variety of shapes including angled, pointed, rounded, wavy, or other shaped notches according to other embodiments herein.

Blower fan 1015 is powered by power source 1040 which may power and control a blower fan motor. Power source 1040 may be operatively connected to a power management system of an information handling system and supply power from a battery power source, an alternating current power source, or other power sources to a blower fan motor (not shown) in various embodiments. Power source 1040 may also include one or more control lines to blower fan 1015.

As described with various embodiments herein, the dual opposite outlet blower system housing may have a width Df between side walls 1022 and 1024 in an example embodiment such that the width Df is the width of the dual opposite outlet blower system housing as taken across the diameter Db of blower fan 1015 according to an embodiment. Blower fan 1015 may have a blade diameter Db that is nearer to the width Df of dual opposite outlet blower system housing between side walls 1022 and 1024 as described than previous blower systems. In various example embodiments, the dual opposite outlet blower system housing of the embodiments of the present disclosure may enable the blower fan diameter Db to occupy greater than 70% of the width Df of the dual opposite outlet blower system housing between side walls 1022 and 1024 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 11:
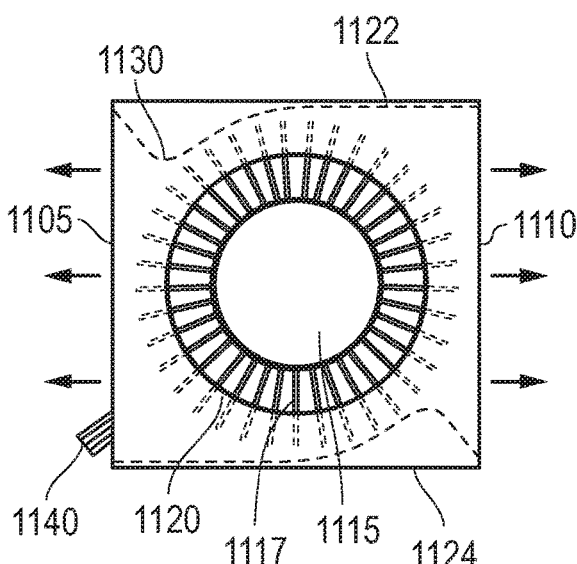
FIG. 11 is a top view of a blower with dual opposite outlets according to another embodiment of the present disclosure.

FIG. 11 shows a top view of a dual opposite outlet blower fan system according to another embodiment of the present disclosure. FIG. 11 is similar to embodiments described above with respect to FIGS. 3A, 3B, 4 and 5 and is depicted such that elements within the dual opposite outlet blower system housing may be viewed internally. The dual opposite outlet blower fan system of FIG. 11 depicts a different fan blade 1117 shape than other embodiments herein. The dual opposite outlet blower fan system includes a blower fan 1115 with fan blades 1117 and a dual opposite outlet blower system housing with side walls 1122 and 1124, a facing surface including an air inlet at aperture 1120, two outlet apertures 1105 and 1110.

The two outlet apertures may be opposite one another in a plane of rotation of blower fan 1115 in one embodiment such that the flow of air out of the dual opposite outlet blower system housing may happen in generally opposite directions. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 1120 to the dual opposite outlet blower system housing may be plural air inlet apertures, may be of any shape, or may be disposed on either face of the dual opposite outlet blower system housing or even on a side wall in some embodiments as described herein.

Fan blades 1117 extend from the fan hub and extend linearly from the fan hub to the fan diameter edge of blower fan 1115 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 11 includes two notches 1130 and 1132. A first notch 1130 extends internally into the dual opposite outlet blower fan system housing from the side wall 1122. First notch 1130 begins a curvilinear shape at the first aperture 1105, curves inward to the dual opposite outlet blower fan system housing, and gradually recedes along the diameter of blower fan 1115 in the direction of rotation of fan 1115 toward second outlet aperture 1110. A second notch 1132 extends internally into the dual opposite outlet blower fan system housing from the side wall 1124. First and second notches 1130 and 1132 provide air pressurization zones along side walls 1122 and 1124 for blower fan 1115 and blades 1117. Although, first and second notches 1130 and 1132 may be a curvilinear shape any shape including angled, pointed, rounded, wavy, or other shaped notches according to other embodiments herein. The internal extension of the notches 1130 and 1132 may also vary depending on desired pressurization and noise minimization according to various embodiments described herein and may depend on determination of a notch angle A and an offset as described with respect to FIG. 3A.

Blower fan 1115 is powered by power source 1140 which may power and control a blower fan motor. Power source 1140 may be operatively connected to a power management system of an information handling system and supply power from a battery power source, an alternating current power source, or other power sources to a blower fan motor (not shown) in various embodiments. Power source 1140 may also include one or more control lines to blower fan 1115.

As described with various embodiments herein, the dual opposite outlet blower system housing may have a width Df between side walls 1122 and 1124 in an example embodiment such that the width Df is the width of the dual opposite outlet blower system housing as taken across the diameter Db of blower fan 1115 and linear blades 1117 according to an embodiment. In various example embodiments, the dual opposite outlet blower system housing of the embodiments of the present disclosure may enable the blower fan diameter Db to occupy greater than 70% of the width Df of the dual opposite outlet blower system housing between side walls 1122 and 1124 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 12:
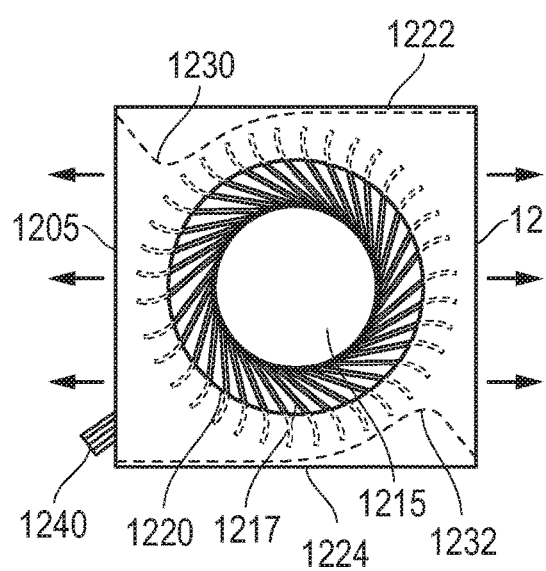
FIG. 12 is a top view of a blower with dual opposite outlets according to another embodiment of the present disclosure.

FIG. 12 shows a top view of a dual opposite outlet blower fan system according to another embodiment of the present disclosure. FIG. 12 is similar to embodiments described above with respect to FIGS. 3A, 3B, 4, 5, and 11 and is depicted such that elements within the dual opposite outlet blower system housing may be viewed internally. The dual opposite outlet blower fan system of FIG. 12 depicts a different fan blade 1217 shape than other embodiments herein. The dual opposite outlet blower fan system includes a blower fan 1215 with fan blades 1217 and a dual opposite outlet blower system housing with side walls 1222 and 1224, a facing surface including an air inlet at aperture 1220, two outlet apertures 1205 and 1210.

The two outlet apertures may be opposite one another in a plane of rotation of blower fan 1215 in one embodiment such that the flow of air out of the dual opposite outlet blower system housing may happen in generally opposite directions. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 1220 to the dual opposite outlet blower system housing may be plural air inlet apertures, may be of any shape, or may be disposed on either face of the dual opposite outlet blower system housing or even on a side wall in some embodiments as described herein.

Fan blades 1217 extend from the fan hub and extend with a curvilinear shape from the fan hub to the fan diameter edge of blower fan 1215 as in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 12 includes two notches 1230 and 1232. A first notch 1230 extends internally into the dual opposite outlet blower fan system housing from the side wall 1222. First notch 1230 begins a curvilinear shape at the first aperture 1205, curves inward to the dual opposite outlet blower fan system housing, and gradually recedes along the diameter of blower fan 1215 in the direction of rotation of fan 1215 toward second outlet aperture 1210. A second notch 1232 extends internally into the dual opposite outlet blower fan system housing from the side wall 1224. First and second notches 1230 and 1232 provide air pressurization zones along side walls 1222 and 1224 for blower fan 1215 and curvilinear blades 1217. Although, first and second notches 1230 and 1232 may be a curvilinear shape any shape including angled, pointed, rounded, wavy, or other shaped notches according to other embodiments herein. The internal extension of the notches 1230 and 1232 may also vary depending on desired pressurization and noise minimization according to various embodiments described herein and may depend on determination of a notch angle A and an offset as described with respect to FIG. 3A.

Blower fan 1215 is powered by power source 1240 which may power and control a blower fan motor. Power source 1240 may be operatively connected to a power management system of an information handling system and supply power from a battery power source, an alternating current power source, or other power sources to a blower fan motor (not shown) in various embodiments. Power source 1240 may also include one or more control lines to blower fan 1215.

As described with various embodiments herein, the dual opposite outlet blower system housing may have a width Df between side walls 1222 and 1224 in an example embodiment such that the width Df is the width of the dual opposite outlet blower system housing as taken across the diameter Db of blower fan 1215 and curvilinear blades 1217 according to an embodiment. In various example embodiments, the dual opposite outlet blower system housing of the embodiments of the present disclosure may enable the blower fan diameter Db to occupy greater than 70% of the width Df of the dual opposite outlet blower system housing between side walls 1222 and 1224 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 13:
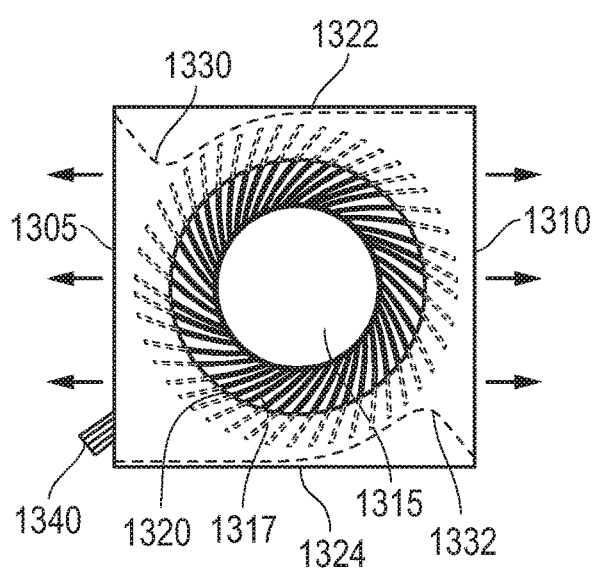
FIG. 13 is a top view of a blower with dual opposite outlets according to yet another embodiment of the present disclosure.

FIG. 13 shows a top view of a dual opposite outlet blower fan system according to yet another embodiment of the present disclosure. FIG. 13 is similar to embodiments described above with respect to FIGS. 3A, 3B, 4, 5, 11, and 12 and is depicted such that elements within the dual opposite outlet blower system housing may be viewed internally. The dual opposite outlet blower fan system of FIG. 13 depicts yet a different fan blade 1317 shape than other embodiments herein. The dual opposite outlet blower fan system includes a blower fan 1315 with fan blades 1317 and a dual opposite outlet blower system housing with side walls 1322 and 1324, a facing surface including an air inlet at aperture 1320, two outlet apertures 1305 and 1310.

The two outlet apertures may be opposite one another in a plane of rotation of blower fan 1315 in one embodiment such that the flow of air out of the dual opposite outlet blower system housing may happen in generally opposite directions. In an example embodiment, the dual opposite outlet blower fan system may have outlet air movement at anywhere from 120 degrees to 240 degrees in opposite directions. In various embodiments, the dual outlet apertures may have varied shapes and sizes including various widths or thicknesses. Similarly, the air inlet 1320 to the dual opposite outlet blower system housing may be plural air inlet apertures, may be of any shape, or may be disposed on either face of the dual opposite outlet blower system housing or even on a side wall in some embodiments as described herein.

Fan blades 1317 extend from the fan hub and extend at an angle from the fan hub in the direction of fan rotation to the fan diameter edge of blower fan 1315 in the shown embodiment. Other embodiments of blade angle and blade shape are shown in other embodiments herein, however, any effective fan blade shape, size, angle or pitch is contemplated and may be used to move air within the dual opposite outlet blower of the embodiments within the present disclosure.

The dual opposite outlet blower fan system housing of FIG. 13 includes two notches 1330 and 1332. A first notch 1330 extends internally into the dual opposite outlet blower fan system housing from the side wall 1322. First notch 1330 begins a curvilinear shape at the first aperture 1305, curves inward to the dual opposite outlet blower fan system housing, and gradually recedes along the diameter of blower fan 1315 in the direction of rotation of fan 1315 toward second outlet aperture 1310. A second notch 1332 extends internally into the dual opposite outlet blower fan system housing from the side wall 1324. First and second notches 1330 and 1332 provide air pressurization zones along side walls 1322 and 1324 for blower fan 1315 and blades 1317. Although, first and second notches 1330 and 1332 may be a curvilinear shape any shape including angled, pointed, rounded, wavy, or other shaped notches according to other embodiments herein. The internal extension of the notches 1330 and 1332 may also vary depending on desired pressurization and noise minimization according to various embodiments described herein and may depend on determination of a notch angle A and an offset as described with respect to FIG. 3A.

Blower fan 1315 is powered by power source 1340 which may power and control a blower fan motor. Power source 1340 may be operatively connected to a power management system of an information handling system and supply power from a battery power source, an alternating current power source, or other power sources to a blower fan motor (not shown) in various embodiments. Power source 1340 may also include one or more control lines to blower fan 1315.

As described with various embodiments herein, the dual opposite outlet blower system housing may have a width Df between side walls 1322 and 1324 in an example embodiment such that the width Df is the width of the dual opposite outlet blower system housing as taken across the diameter Db of blower fan 1315 and linear blades 1317 according to an embodiment. In various example embodiments, the dual opposite outlet blower system housing of the embodiments of the present disclosure may enable the blower fan diameter Db to occupy greater than 70% of the width Df of the dual opposite outlet blower system housing between side walls 1322 and 1324 up to just less than the width of the dual opposite outlet blower system housing across the fan diameter in the plane of rotation. Accordingly, improvement in function of the dual opposite outlet blower fan system for moving air over previous blower systems may be obtained without sacrificing size or chassis occupancy as described in the present disclosure.

Figure 14:
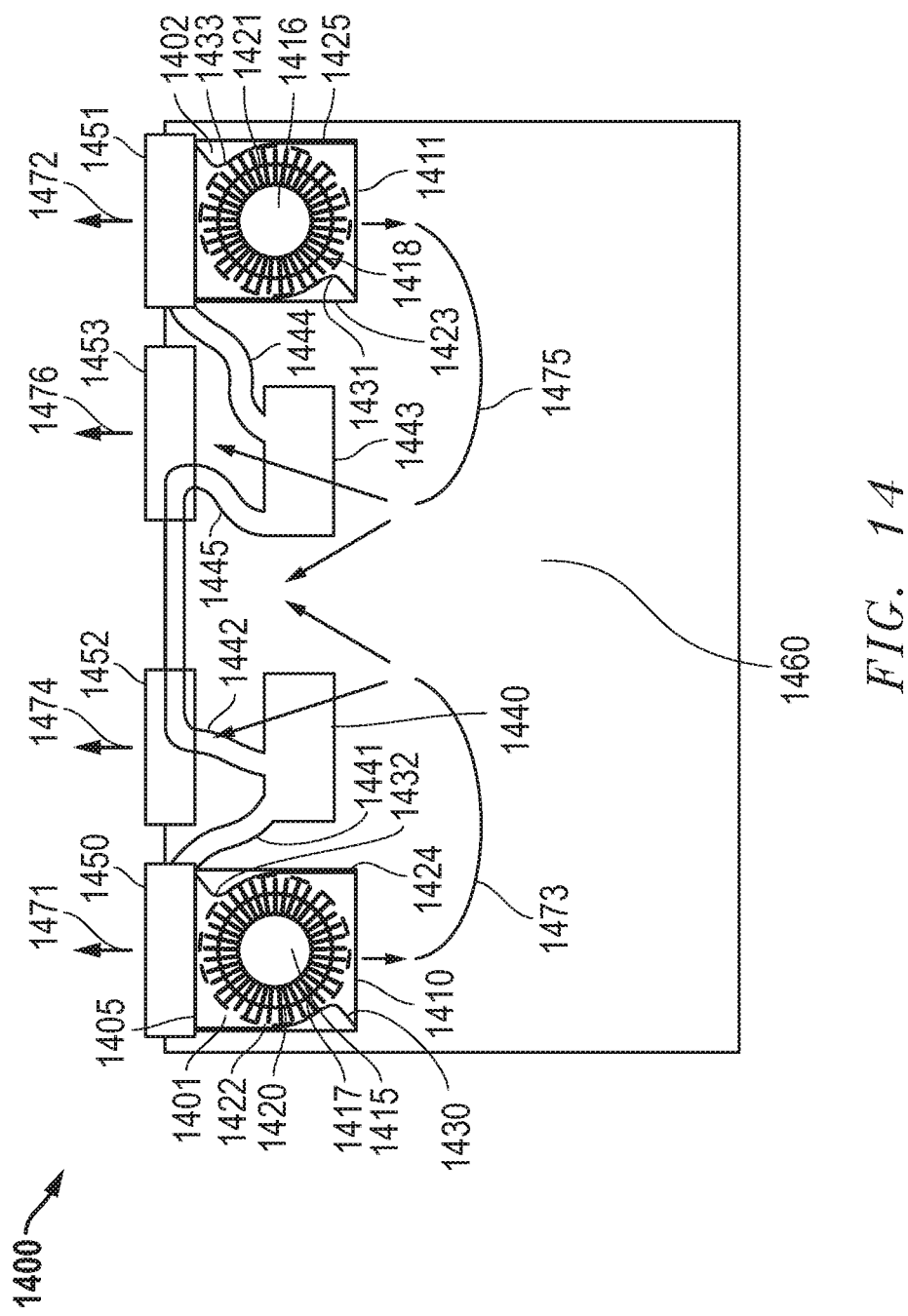
FIG. 14 is a top view of an information handling system with a blower having dual opposite outlets according to an embodiment of the present disclosure.

FIG. 14 shows a top view of an information handling system chassis 1400 having a dual opposite outlet blower fan system according to an embodiment of the present disclosure. FIG. 14 is depicted such that elements within the information handling system chassis including a first dual opposite outlet blower system housing 1401 and a second dual opposite blower system housing 1402 may be viewed internal to the chassis 1400.

First dual opposite outlet blower system housing 1401 is shown disposed in information handling system chassis 1400 having a blower fan 1415 with blades 1417, a first side wall 1422 with a first notch 1430, a second side wall 1424 with a second notch 1432, a first outlet aperture 1405 oppositely disposed from a second outlet aperture 1410 in the plane of rotation of fan 1415, and an inlet aperture 1420. Inlet aperture 1420 is aligned in the present embodiment with an intake vent of chassis 1400 in an embodiment. In an example embodiment, the intake vent is in the bottom of an information handling system chassis. In other embodiments, the intake vent may be on top, or on any side of the information handling system chassis 1400.

Second dual opposite outlet blower system housing 1402 is also shown disposed in information handling system chassis 1400 having a blower fan 1416 with blades 1418, a first side wall 1423 with a first notch 1431, a second side wall 1425 with a second notch 1433, a first outlet aperture 1406 oppositely disposed from a second outlet aperture 1411 in the plane of rotation of fan 1416, and an inlet aperture 1421. Inlet aperture 1421 is aligned in the present embodiment with an intake vent of chassis 1400 in an embodiment. In an example embodiment, the intake vent is in the bottom of an information handling system chassis. In other embodiments, the intake vent may be on top, or on any side of the information handling system chassis 1400.

Airflow from the first dual opposite outlet blower system housing 1401 and the second dual opposite outlet blower system housing 1402 are shown in FIG. 14 with respect to the information handling system chassis 1400. Exhaust vents embedded in the side of the information handling system chassis 1400 in an embodiments. In one example embodiment as shown, fin stacks 1450, 1451, 1452, and 1453 are disposed adjacent or proximate to exhaust vents of the information handling system chassis 1400.

In one embodiment, fin stack 1450 is disposed between the outlet aperture 1405 of the first dual opposite outlet blower system housing 1401 and an exhaust vent of the chassis 1400. Airflow 1471 shows the first dual opposite outlet blower system housing 1401 exhausting air from the exhaust vent via blower fan 1415 and outlet aperture 1405. Airflow 1471 is forced across fin stack 1450. In an embodiment, fin stack 1450 may be thermally coupled to a heat producing component via heat pipe 1441 and cold plate 1440. Heat pipe 1441 and cold plate 1440 may be thermally coupled on or adjacent to a heat producing component such as a processor (not shown) in an embodiment according to thermal management system techniques understood by those of skill in the art. In one example embodiment, cold plate 1440 may be thermally coupled via thermally conductive attachment, directly or via thermally conductive layers of material, to a central processor. In another example embodiment, cold plate 1440 may be thermally coupled to a graphics processor. Thermal coupling may be achieved by other methods as well. For example, thermal coupling between a heat producing component such as a CPU or GPU and fin stacks may be achieved via liquid cooling, vapor chambers, or other systems for transferring heat to a heat exchanger.

In a further embodiment, airflow 1473 shows the first dual opposite outlet blower system housing 1401 forcing air via blower fan 1415 and outlet aperture 1410 into a pressurized zone 1460 in an internal cavity of information handling system chassis 1400. Airflow 1474 may be forced across fin stack 1452 at another exhaust vent of the information handling system chassis 1400 from pressurized zone 1460 in an example embodiment. Fin stack 1452 may also be thermally coupled to cold plate 1440 via heat pipe 1442 in an embodiment. In such an embodiment, the pressurized zone 1460 in the internal cavity of information handling system chassis 1400 provides for flexibility of placement of heat stacks within the information handling system chassis 1400. Moreover, the pressurized zone 1460 provides for additional air movement within the internal cavity of information handling system chassis 1400 to further cool cold plate 1440 as well as other components.

In one aspect, information handling system chassis 1400 is a case including a top surface, bottom surface, and sides. Information handling system chassis 1400 may be a case for housing one or more processors, memory, wireless network adapter, connectors, power systems and other components such as for a mobile information handling system including a laptop, tablet, dual screen tablet, mobile smart phone, or similar devices. Information handling system chassis 1400 may also be a case for housing processors, memory, power systems, connectors and the like for other information handling systems such as desktops, server systems, routers, switches, intelligent communication systems, wireless transmitters, wireless adapters, and the like. Information handling system chassis 1400 may include a variety of sealing measures to better seal an internal cavity to assist with pressurization of the pressurized zone 1460 of the current embodiments. For example, gaskets, adhesives, and high tolerance connectors at seams may be used among the connecting panels forming the top, bottom, sides, or edges of the information handling system chassis in some embodiments. Further, sealed data ports and power ports, sealed keyboard components and other I/O input components, as well as sealed hinge elements may be used in other embodiments. Gaskets or other known sealing measures may also be used with inlet vents as well as around exhaust vents in yet other embodiments. These sealing measures are used to direct pressurized air in pressurized zone 1460 of the internal cavity to exhaust vents to provide for direction to co-located fin stacks such as 1452 and 1453 in some embodiments. In one example embodiment where not all components shown in FIG. 14 are necessarily included fin stacks 1452 and 1453 may not be used and cooling air in pressurized zone 1460 may be exhausted at exhaust vents as shown. Such movement of cooling air within the chassis may be sufficient without the additional fin stacks at those exhaust vents. Any combination of exhaust vents, fin stacks, and any number of dual opposite outlet blower fan systems are contemplated as used within an information handling system chassis. Such variation is contemplated because these dual opposite outlet blower fan systems may be utilized with a wide variety of information handling systems with a vast number of combinations of components and chassis layouts.

It is understood that dual opposite outlet blower system housings 1401 or 1402, processor components, fin stacks 1450-1453, and various other components may be arranged in a variety of locations in the information handling system chassis 1400 according to variations on the current embodiments. Moreover, one or more of dual opposite outlet blower system housings 1401 or 1402, fin stacks 1450-1453, cold plates 1440 or 1443, or other components may not occur in all embodiments. The internally pressurized cavity of information handling system chassis provides for placement of exhaust vents and fin stacks near the exhaust vents at a variety of locations providing flexibility for layout of components in the information handling system chassis 1400 and saving costs and improving space usage efficiency. For example, some information handling systems may only utilize a combined central processor and graphics processor in some example embodiments. Further, dual opposite outlet blower system housings 1401 or 1402 may be of any embodiment or variation of the embodiments of FIGS. 3A-13 as shown or described herein. In other example embodiment, not all of the elements shown in the information handling system chassis 1400 need appear in all embodiments contemplated by the embodiments herein. For example, some embodiments of information handling system may include only one dual opposite outlet blower fan system and may have only a CPU and require fewer or only one fin stack. One of the opposite outlets in such an embodiment that points inside the information handling system chassis for example could exhaust through a simple mechanical slot and may not require a co-located fin stack. Such internal air flow still accomplishes convection air cooling of all components within the information handling system chassis. Various combinations of numbers of dual opposite outlet blower fan systems, fin stacks, cold plates and the like are contemplated as embodiment variations on that described with respect to FIG. 14.

In yet another embodiment, fin stack 1451 is disposed between the outlet aperture 1406 of the second dual opposite outlet blower system housing 1402 and an exhaust vent of the chassis 1400. Airflow 1472 shows the second dual opposite outlet blower system housing 1402 exhausting air from the exhaust vent via blower fan 1416 and outlet aperture 1406. Airflow 1472 is forced across fin stack 1451. In an embodiment, fin stack 1451 may be thermally coupled to a heat producing component via heat pipe 1444 and cold plate 1443. Heat pipe 1444 and cold plate 1443 may be thermally coupled on or adjacent to a heat producing component such as a processor (not shown) in an embodiment according to thermal management system techniques understood by those of skill in the art. In one example embodiment, cold plate 1443 may be thermally coupled via thermally conductive attachment, directly or via thermally conductive layers of material, to a central processor. In another example embodiment, cold plate 1443 may be thermally coupled to a graphics processor.

In yet a further embodiment, airflow 1475 shows the first dual opposite outlet blower system housing 1402 forcing air via blower fan 1416 and outlet aperture 1411 into the pressurized zone 1460 in an internal cavity of information handling system chassis 1400. Airflow 1476 may be forced across fin stack 1453 out an exhaust vent of the information handling system chassis 1400 from pressurized zone 1460 in an example embodiment. Fin stack 1453 may also be thermally coupled to cold plate 1443 via heat pipe 1445 in an embodiment. In such an embodiment, the pressurized zone 1460 in the internal cavity of information handling system chassis 1400 provides for flexibility of placement of heat stacks within the information handling system chassis 1400. Moreover, the pressurized zone 1460 provides for additional air movement within the internal cavity of information handling system chassis 1400 to further cool cold plate 1443 as well as other components.

It is understood that dual opposite outlet blower system housings 1401 or 1402, processor components, fin stacks 1450-1453, and various other components may be arranged in a variety of locations in the information handling system chassis 1400 according to variations on the current embodiments. Moreover, one or more of dual opposite outlet blower system housings 1401 or 1402, fin stacks 1450-1453, cold plates 1440 or 1443, or other components may not occur in all embodiments. For example, some information handling systems may only utilize a combined central processor and graphics processor in some example embodiments. Further, dual opposite outlet blower system housings 1401 or 1402 may be of any embodiment or variation of the embodiments of FIGS. 3A-13 as shown or described herein.

Figure 15:
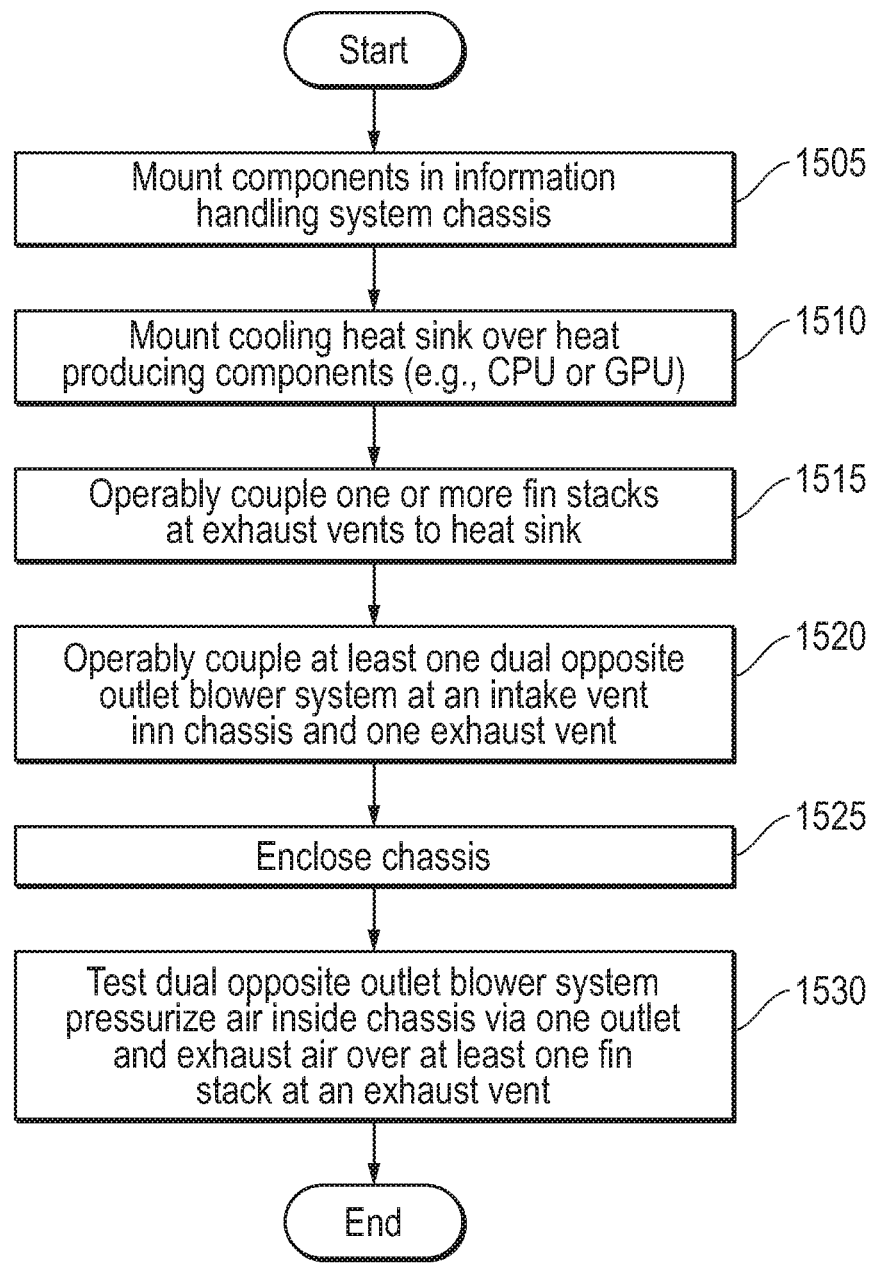
FIG. 15 is a flow diagram illustrating method of assembly of an information handling system with a blower having dual opposite outlets according to an embodiment of the present disclosure.

FIG. 15 shows a method of assembling an information handling system having a dual opposite outlet blower system and thermal management system according to a plurality of embodiments disclosed in the present disclosure. At 1505, a selection of components for a model specification are mounted in an information handling system chassis according to a layout for such a model specification. Processors, embedded controllers, microcontrollers or other processing logic may be mounted on a motherboard for example. For example, at least one CPU, which may include an onboard GPU, may be mounted on a motherboard in one example embodiment. In another example embodiment, a GPU may be mounted on a graphics card that is part of or in addition to a motherboard. Memory, network interface adapters either wired or wireless, and power systems including power management unit, battery systems, and power source connections, digital to analog converters and the like may all also be mounted within an information handling system chassis. In yet other embodiments, switching systems, power transformers, and other components may be included in an information handling system chassis. For example, many of the components of an information handling system as described in FIG. 1 or supporting those systems of FIG. 1 and other information handling systems understood in the art may be mounted in an information handling system chassis.

Mounting of components in the information handling system chassis may occur by conventional methods for each type of component. For example, mounting of microchips for processing logic, memory, controls, power control systems, network interfacing, graphics, sound, or other processing capabilities may be mounted on chip mounts with solder connection, compression connection, plug and socket connection, inductive connection, or the like. Boards such as motherboards, graphics boards, power management boards, memory boards, sound boards, interface boards, or the like may be combination boards or individual boards in accordance with the subsystems of information handling systems understood by those in the art or as described, for example, with the various embodiments of FIG. 1 or others described herein.

In one aspect, motherboard components may include a CPU, a CPU mount, a plurality of memory chips, power management system chips, wireless adapter chips, network adapter or I/O connector driver chips, sound chips, as well as CPU location, memory locations, the CPU chip pin breakout memory pin breakout in the PCB. Further, the system may include routing between the CPU, GPU, power management system, wireless and wired interface adapters, and memory. Additional motherboard aspects include power planes under the CPU and memory to support their operation as well as bus connectivity interface links to other parts of the information handling system including those of PCIe, DisplayPort, or other display data bus connectivity. In another aspect, graphics board components may include a GPU, a GPU mount, a plurality of graphics memory chips and the GPU location, memory locations, the GPU chip pin breakout memory pin breakout in the PCB, and routing between the GPU and graphics memory. Additional graphics board aspects include power planes under the GPU and memory to support their operation as well as bus connectivity interface links to other parts of the information handling system including those of PCIe, DisplayPort, or other display data bus connectivity. One or more of the above chips may be combined, as is understood in the art, into single microchips. For example, some information handling systems may include combination CPU and GPU processing. Boards may be mounted with connectors such as screws, clips, clamps, slots, compression connections, snap fit connections or other known and understood by those of skill in the art. Further, the location of the external data ports for the data connectivity including display data, such as DisplayPort, HDMI, USB, or other display data communication port components as well as I/O devices integrated in some embodiments such as keyboards, keypads or the like are set out for the information handing system chassis. Some of these components are added at various stages of the assembly as appropriate and may be different among various models or types of information handling systems. Selection of the chassis layout with respect to the various information handling system subsystem components is more flexible with respect to thermal management locations due to the improvements available with the dual opposite outlet blower fan system of the present disclosure.

Proceeding to 1510, the assembly includes installation of components of a thermal management system including the dual opposite outlet blower fan system of the present disclosure. The order of assembly of components of the information handling system including the dual opposite outlet blower fan system or systems of the present disclosure is not necessarily ordered as set forth in the example of FIG. 15, however. In an example embodiment, the base of the chassis of the information handling system chassis is assembled and components including microchips, memory structures, boards and the like are mounted. Connections between subsystems and ports may occur followed by thermal and power connections. Installation of the dual opposite outlet blower fan system of the present disclosure may occur at any time in any order under various embodiments. As part of that thermal management system, a head sink may be mounted over one or more heat producing components in the chassis of the information handling system. The cold plate, for example such as that shown as 1440 and 1443 in FIG. 14, may be mounted adjacent to a heat producing component and may be in physical contact with that component or may be operatively and thermally coupled with that heat producing component through thermally conductive layers such as thermally conductive pads, thermally conductive adhesive, thermally conductive connectors, or the like. Any thermal contact system and method may be used to thermally couple the cold plate to the heat producing component. Heat producing components frequently include processing logic such as CPUs and GPUs as well a power system components in various embodiments. Additional components may include active switch and router logic, microcontroller, transmission systems, power management components, power line connectors and traces, lighting, and similar components in some embodiments.

At 1515, the cold plate, for example such as that shown as 1440 and 1443 in FIG. 14, may be operatively and thermally coupled to one or more fin stacks in the information handling system chassis. Fin stacks include a plurality of fins for dissipation of heat as understood in the art. The fin stack in some embodiments may be part of the same unit as a cold plate. In other embodiments, a fin stack may be operatively and thermally coupled to a cold plate. In yet other embodiments, one or more fin stacks may be operatively and thermally coupled to a cold plate via a heat pipe. For example, cold plate 1440 is thermally and operatively coupled to fin stacks 1450 and 1452 in FIG. 14 via heat pipes 1441 and 1442. Similarly, cold plate 1443 is thermally and operatively coupled to fin stacks 1451 and 1453 in FIG. 14 via heat pipes 1444 and 1445. Cold plate, heat pipe, and fin stack may be a single unit made of thermally conductive material such as thermally conductive metals or may be one or more individual components thermally and operatively coupled. Placement of the fin stacks is flexible with the dual opposite outlet blower fan system of the present disclosure. The location of the fin stacks and dual opposite outlet blower fan system are flexible as is the location of exhaust vents from the information handling system chassis with internal pressurization of the chassis. The fin stacks may be more advantageously placed near exhaust vent locations of the information handling system chassis. Thus, air may be pushed across those fin stacks by an outlet aperture of the dual opposite outlet blower fan system of the present disclosure or by pressurized air in the cavity of the information handling system chassis due to an outlet of the dual opposite outlet blower fan system. In an embodiment, the fin stack or fin stacks are located at or near exhaust vents of the information handling system.

At 1520, the dual opposite outlet blower fan system of the present disclosure may be mounted in an information handling system. Inlet aperture may be aligned with an inlet vent of the information handling system chassis surface in one embodiment. At least one outlet aperture of the dual opposite outlet blower fan system may be located near an exhaust vent of the information handling system chassis. The other outlet aperture of the dual opposite outlet blower fan system may be directed inward to the information handling system chassis to pressurize the cavity therein.

Proceeding to 1525, after final components such as external data and power connectors, inlet vents and exhaust vents, integrated I/O devices such as keyboards, touchpads, touchscreens, display screens, indicator lights, hinge components, or any other components are mounted on or in the information handling system chassis, the chassis may be enclosed. Prior to enclosure, sealing measures may be taken. This may include sealing any seams between top, bottom, side, or edge panels with gaskets, adhesive, sealant materials, or via other methods in some embodiments. Also, the method may provide for sealing of I/O data ports and I/O devices integrated in the information handling system chassis with gaskets or panels to limit airflow from those ports or devices in other embodiments. It is important to note that perfect sealing measures are not required for all embodiments. In fact, in some embodiments some leakage might be advantageous as it draws air over one or more remote components. For example, a Thunderbolt controller or other specialized controller may draws a high average amount of wattage. In the case of such as component, such as a Thunderbolt controller, it may be placed by its respective Universal Serial Bus (USB) Type-C ports. A small leakage through the USB Type-C ports may be undetectable by the user, but still alleviate heat build-up around the controller chip.

Then the panels and edges of the information handling system may be enclosed together to form an internal cavity of the information handling system chassis to support and contain most of the aforementioned components or support those components with outside interfacing. This may include one or more of each of a top panel, bottom panel, side panels, edges, or some combination. It is understood that any contour, design, shape, or structure may be used in the panels or edges and the directions top, bottom, side, or edge are relative terms to a generally rectangular box-shaped chassis, however any shape chassis is contemplated. In one example embodiment, the bottom panel face of the information handling system chassis for a laptop may include an inlet intake vent aligned over the dual opposite outlet fan system. In another example embodiment, a side panel or an edge of a laptop may include one or more exhaust vents. For a mobile information handling system such as a laptop, tablet, dual screen tablet or for other information handling systems such as servers, desktops, routers, access points, or others any orientation of inlet intake vents and exhaust vents is contemplated for various embodiments. To enclose the information handling system chassis, any number of chassis enclosure methods may be used including snap fit enclosure of top, bottom, side, or edge panels or via use of fasteners such as screws, clips, slots, clamps, or other fastening or clamping systems understood in the art.

Proceeding to 1530, in an optional embodiment, the assembly method may include testing the operation of the dual opposite outlet blower fan system with the assembled information handling system. This may include connecting the information handling system to power and controlling or operating the information handling system until the thermal management system turns the dual opposite outlet blower fan system on. Upon the activation of the dual opposite outlet fan system, air will enter the inlet intake vent. One outlet aperture will blow air out a nearby exhaust vent an over an intermediate fin stack. Another outlet aperture of the dual opposite outlet blower fan system will push air into the internal cavity of the information handling system chassis causing air to outlet at other exhaust vents in the information handling system chassis. At this point the process may end. It is appreciated that the process described with respect to FIG. 15 may be utilized for any model or type of information handling system and the model specification may determine the information handling system chassis layout. With the dual opposite outlet fan system, the flexibility of adapting a thermal management system to location of inlet and exhaust vents in the information handling system chassis is flexible allowing designs to minimize space usage, allow placement of components in a variety of locations as desired for design considerations, to generate maximum cooling effect by the thermal management system, or some combination. Such a feature is beneficial to costs and time of development of graphics boards for use with model specification assemblies for a wide variety of information handling system models and types and further improving overall design efficiencies.

The depictions in FIGS. 1-13 are meant for illustration and do not necessarily represent accurate sizes or relationships between aspects of the dual opposite outlet blower system housing, the blower fan and blades, fan hub, apertures and other structures except as specified herein. Size and shape of fan blades, thickness of blower fan, size and shape of outlet apertures and inlet apertures, and size and shape of side wall notches may all be varied in multiple embodiments and in any combination. In an embodiment, the size and shape of one or both the outlet apertures may be smaller or larger than the width or thickness of the dual opposite outlet blower system housing. In another embodiment, the side wall notches may be angled, pointed, slanted, curvilinear, rounded, or of a variety of shapes along the side walls of the dual opposite outlet blower system. In yet another example embodiment, one or more inlet apertures may be of any size or shape.

Further in FIG. 14, the central processor, graphics processor, heat pipe, fin stacks, thermal system, exhaust vents and other components of the information handling system depicted therein are also meant for illustration and do not necessarily represent accurate sizes or relationships between aspects. It may also be appreciated that variations on the configurations are also contemplated including location and alignments of central processor, graphics processor which may be separate or combined with the central processor, dual opposite outlet blower system, heat pipe, fin stacks, thermal system, exhaust vents, inlet vents, and other components of the information handling system and are meant for illustration and do not necessarily represent any limitation on location or relationships between those components within an information handling system chassis. For example, location central processor, any separate graphics processor or other heat producing component, the dual opposite outlet blower system, heat pipe, fin stacks, thermal system, exhaust vents, inlet vents, and other components is meant to be flexible in location due to the pressurization of the internal space of the information handling system chassis by the dual opposite outlet blower system. Similarly, the location of a plurality of dual opposite outlet blower system may vary as well. Other variations of the embodiments for location, size and relationships of components herein are contemplated.

It is understood that the structures and concepts described in the embodiments above for FIGS. 1-14 may be constructed using a variety of the components. For example, the dual opposite outlet blower system housing may be any of or a combination of a metal, plastic, acrylic, or other strong material. The dual opposite outlet blower system housing may include portions, such as the side walls and top and bottom surfaces that are a single component or assembled of one or more components. Notches in the side walls may be formed of the side walls or may be component additions added to the side walls. As described, a variety of sizes of the side wall notches may be selected to modify pressure generation or affect noise developed during operation of the dual opposite outlet blower system. The dual opposite outlet blower system housing may have a blower fan installed with motor and power source connection and mounted on a first or second surface. The first or second surface of the dual opposite outlet blower system housing may be mounted in an information handling system in any orientation and is not limited to a top surface or bottom surface as described with respect to the drawing embodiments herein for purposes of illustration. The blower fan may include a variety of blower fan types including blade shapes and hub diameters as described herein or understood in the art. Further, the blower fan, blower fan motor, blades, and power connection may be comprised of materials used by those of skill in the art to build such blower fans. It is also understood that for the methods in FIG. 15 some steps may be omitted, additional steps may be performed, or steps may not be performed in the order depicted according to variations of the embodiments as understood by those of skill. In particular, for embodiments of the figures disclosed herein, some varied embodiments may utilize certain components or techniques which may also be combined with portions of any other embodiments in the present disclosure to form a variety of additional embodiments from aspects of those embodiments described herein.

In some embodiments, dedicated hardware implementations such as application specific integrated circuits, programmable logic arrays and other hardware devices can be constructed to comprise one or more of the internal components described herein or portions of one or more of the internal components described herein including processors requiring thermal management. Applications that may include the apparatus and systems of various embodiments can broadly include a variety of electronic and computer systems. One or more embodiments described herein may implement functions using one or more specific interconnected hardware structures to provide a flexible thermal management system with improved air movement capability among internal components of an information handling system while maintaining a unibody appearance of the chassis.

In accordance with various embodiments of the present disclosure, the dual opposite outlet blower system housing and fan blower may be operatively coupled, mounted, or otherwise attached within an information handling system chassis via attachment methods or structures described or as understood by those of skill in the art to mount components in an information handling system. Example specific methods and structures include screws, adhesives, clips, slots, clamps, pads, wires, foam, springs, welds, and others as described herein and which may be implemented by numerous embodiments described.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as an Intel® Core™ or ARM® RISC brand processors, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or structures that are operatively coupled with one another need not be in continuous coupling or communication with each other, unless expressly specified otherwise. In addition, devices, modules, resources, or structures that are in operatively coupled with one another can be coupled directly or indirectly through one or more intermediaries. Further, devices, structures or other aspects of the dual opposite outlet blower system for information handling systems described or shown as coupled or connected to one another may be connected or coupled in all cases through one or more additional intermediary structures or devices or some structures and devices may not be needed or intermediary as shown or described. Several example embodiments are described where such a coupling or connection of structures may exist.

Although only a few exemplary embodiments have been described in detail herein, those skilled in the art will appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A dual opposite outlet blower system comprising:
   a power source and a blower fan motor for rotating a blower fan having a plurality of blades and a fan diameter for rotation of the blower fan in a rotational plane;
   a dual opposite outlet blower system housing including first surface having an fan inlet aperture, a second surface oppositely disposed of the first surface on which the blower fan is operatively coupled inside the dual opposite outlet blower system housing, a first side wall having a first notch extending inward along the fan diameter, and a second side wall oppositely disposed to the first side wall and having a second notch extending inward along the fan diameter to form the dual opposite outlet blower system housing;
   the dual opposite outlet blower system housing including a first outlet aperture between the first side wall and the second side wall in the rotational plane of the blower fan, where the first outlet aperture has a first curved aperture outlet zone to provide a wide directionality to airflow out from the dual opposite outlet blower system housing; and
   the dual opposite outlet blower system housing including a second outlet aperture between the first side wall and the second side wall in the rotational plane of the blower fan disposed opposite the first outlet aperture.

2. The dual opposite outlet blower system of claim 1 wherein the first curved aperture outlet zone to provide a wide directionality to airflow out from the dual opposite outlet blower system housing is formed on a side of the first outlet aperture along the first side wall opposite the second notch.

3. The dual opposite outlet blower system of claim 1 wherein the second outlet aperture has a second curved aperture outlet zone to provide a wider directionality to airflow out from the dual opposite outlet blower system housing.

4. The dual opposite outlet blower system of claim 3 wherein the second curved aperture outlet zone to provide a wide directionality to airflow out from the dual opposite outlet blower system housing is formed on a side of the second outlet aperture along the second side wall opposite the first notch.

5. The dual opposite outlet blower system of claim 1 wherein the first outlet aperture includes both the first curved aperture outlet zone and a second curved outlet aperture zone formed at both sides of the first outlet aperture along the first side wall and the second side wall.

6. The dual opposite outlet blower system of claim 5 wherein the second outlet aperture includes both a third curved aperture outlet zone and a fourth curved outlet aperture zone formed at both sides of the second outlet aperture along the first side wall and the second side wall.

7. The dual opposite outlet blower system of claim 1 wherein the fan diameter including the plurality of blades is greater than 90% of a width of the dual opposite outlet blower system housing between the first side wall and the second side wall.

8. The dual opposite outlet blower system of claim 1 wherein the first notch is a curvilinear extension inward of the first side wall to pressurize air upon rotation of the blower fan in the dual opposite outlet blower system housing along the first side wall.

9. An information handling system comprising:
a chassis with a central processor, a memory, and a power source;
a dual opposite outlet blower system for thermal management comprising:
a powered blower fan for rotating a plurality of blades within a dual opposite outlet blower system housing;
the dual opposite outlet blower system housing including first surface and a second surface oppositely disposed on either side of a rotational plane of the powered blower fan, wherein the first surface or second surface has a fan inlet aperture;
the dual opposite outlet blower system housing having a first side wall and second side wall oppositely disposed to the first side wall and disposed between the first surface and the second surface;
a first notch of the first side wall and a second notch of the second side wall extending internally along opposite sides of a diameter of the powered blower fan in the rotational plane;
a first outlet aperture in the rotational plane of the blower fan moving air in a first direction to pressurize an internal cavity of the chassis, where the first outlet aperture has a first curved aperture outlet zone to provide a wide directionality to airflow out from the dual opposite outlet blower system housing; and
a second outlet aperture in the rotational plane of the blower fan moving air in a second direction generally opposite to the first direction of the first outlet aperture.

10. The system of claim 9, further comprising:
the second outlet aperture in the rotational plane of the blower fan has a second curved aperture outlet zone to provide a wide directionality to airflow out from the dual opposite outlet blower system housing.

11. The system of claim 9 wherein the first curved aperture outlet zone to provide a wide directionality to airflow out from the dual opposite outlet blower system housing is formed on a side of the first outlet aperture along the first side wall opposite the second notch.

12. The system of claim 10 wherein the second curved aperture outlet zone to provide a wide directionality to airflow out from the dual opposite outlet blower system housing is formed on a side of the second outlet aperture along the second side wall opposite the first notch.

13. The system of claim 9 wherein the first outlet aperture has a second curved aperture outlet zone to provide a wider directionality to airflow out from the dual opposite outlet blower system housing on an opposite side of the first outlet aperture to the first curved aperture outlet zone.

14. The dual opposite outlet blower system of claim 13 wherein the second outlet aperture includes both a third curved aperture outlet zone and a fourth curved outlet aperture zone formed at both sides of the second outlet aperture along the first side wall and the second side wall.

15. The system of claim 9 further comprising:
a cooling fin stack located at the second outlet aperture of the dual opposite outlet blower system housing disposed between the second outlet aperture and an information handling system chassis outlet vent.

16. The system of claim 9, further comprising:
a second dual opposite outlet blower system for thermal management.

17. The system of claim 9, further comprising:
the first surface of the dual opposite outlet blower system housing operatively having the fan inlet aperture coupled to a chassis inlet vent such that the fan inlet aperture draws air from outside the information handling system chassis.

18. An information handling system comprising:
a chassis with a central processor, a memory, and a power source;
a dual opposite outlet blower system for thermal management comprising:
a powered blower fan for rotating a plurality of blades within a dual opposite outlet blower system housing;
the dual opposite outlet blower system housing including first surface and a second surface oppositely disposed on either side of a rotational plane of the powered blower fan, wherein the first surface or second surface has a fan inlet aperture coupled to a chassis inlet vent such that the fan inlet aperture draws air from outside the information handling system chassis;
the dual opposite outlet blower system housing having a first side wall and second side wall oppositely disposed to the first side wall and disposed between the first surface and the second surface;
a first notch of the first side wall and a second notch of the second side wall extending internally along opposite sides of a diameter of the powered blower fan in the rotational plane;
a first outlet aperture in the rotational plane of the blower fan moving air in a first direction to pressurize an internal cavity of the chassis, where the first outlet aperture has a first curved aperture outlet zone to provide a wide directionality to airflow out from the dual opposite outlet blower system housing; and
a second outlet aperture in the rotational plane of the blower fan moving air in a second direction generally opposite to the first direction of the first outlet aperture, where the second outlet aperture has a second curved aperture outlet zone to provide a wide directionality to airflow out from the dual opposite outlet blower system housing.

19. The dual opposite outlet blower system of claim 18 wherein the first outlet aperture includes both the first curved aperture outlet zone and a third curved outlet aperture zone formed at both sides of the first outlet aperture along the first side wall and the second side wall.

20. The dual opposite outlet blower system of claim 18 wherein the second outlet aperture includes both the second curved aperture outlet zone and a fourth curved outlet aperture zone formed at both sides of the first outlet aperture along the first side wall and the second side wall.

* * * * *